(12) United States Patent
Murphy et al.

(10) Patent No.: US 12,230,620 B2
(45) Date of Patent: Feb. 18, 2025

(54) DEVICES COMPATIBLE WITH NIGHT VISION EQUIPMENT

(71) Applicant: Dolby Intellectual Property Licensing, LLC, Niskayuna, NY (US)

(72) Inventors: James Edward Murphy, Niskayuna, NY (US); Samuel Joseph Camardello, Ballston Spa, NY (US)

(73) Assignee: Dolby Intellectual Property Licensing, LLC, Niskayuna, NY (US)

( * ) Notice: Subject to any disclaimer, the term of this patent is extended or adjusted under 35 U.S.C. 154(b) by 0 days.

(21) Appl. No.: 18/116,260

(22) Filed: Mar. 1, 2023

(65) Prior Publication Data
US 2023/0246013 A1 Aug. 3, 2023

Related U.S. Application Data

(63) Continuation of application No. PCT/US2021/048535, filed on Aug. 31, 2021, which
(Continued)

(51) Int. Cl.
*G02B 23/12* (2006.01)
*B60R 11/02* (2006.01)
(Continued)

(52) U.S. Cl.
CPC ............ *H01L 25/167* (2013.01); *B60R 11/02* (2013.01); *G02B 23/12* (2013.01); *G06F 1/1613* (2013.01);
(Continued)

(58) Field of Classification Search
CPC .............................. G09G 3/2003; G02B 23/12
(Continued)

(56) References Cited

U.S. PATENT DOCUMENTS 3,252,613 A  5/1966  McGrath
3,457,179 A  7/1969  Natansohn
(Continued)

FOREIGN PATENT DOCUMENTS

CN    102220131 A    10/2011
CN    109957400 A    7/2019
(Continued)

OTHER PUBLICATIONS

International Search Report and Written Opinion of the International Searching, Authority, dated Dec. 21, 2021 for International Application No. PCT/US2021/048535.
(Continued)

*Primary Examiner* — Christopher M Raabe
(74) *Attorney, Agent, or Firm* — Armstrong Teasdale LLP

(57) ABSTRACT

The present disclosure relates to a device used in conjunction with night vision equipment. The device including an LED light source optically coupled and/or radiationally connected to a phosphor material including a green-emitting phosphor and a red-emitting phosphor of formula I:

$$A_xMF_y:Mn^{4+} \qquad I$$

wherein A is Li, Na, K, Rb, Cs, or a combination thereof, M is Si, Ge, Sn, Ti, Zr, Al, Ga, In, Sc, Hf, Y, La, Nb, Ta, Bi, Gd, or a combination thereof, x is an absolute value of a charge of the $MF_y$ ion; and y is 5, 6 or 7. The device limits emission of wavelengths longer than 650 nm to less than 1.75% of total emission. A device including an LED light source optically coupled and/or radiationally connected to a red-emitting phosphor including $Na_2SiF_6:Mn^{4+}$ is also provided.

24 Claims, 14 Drawing Sheets

Related U.S. Application Data is a continuation-in-part of application No. PCT/US2021/027105, filed on Apr. 13, 2021.

(60) Provisional application No. 63/073,386, filed on Sep. 1, 2020.

(51) Int. Cl.

| | |
|---|---|
| *G06F 1/16* | (2006.01) |
| *G09G 3/20* | (2006.01) |
| *G09G 3/34* | (2006.01) |
| *H01L 25/16* | (2023.01) |
| *H01L 33/00* | (2010.01) |
| *H01L 33/50* | (2010.01) |
| *B60R 11/00* | (2006.01) |

(52) U.S. Cl.
CPC .......... *G09G 3/2003* (2013.01); *G09G 3/3406* (2013.01); *H01L 33/0062* (2013.01); *H01L 33/502* (2013.01); *B60R 2011/0005* (2013.01)

(58) Field of Classification Search
USPC .......................................................... 257/79
See application file for complete search history.

(56) References Cited

U.S. PATENT DOCUMENTS

| | | | |
|---|---|---|---|
| 3,509,064 | A | 4/1970 | Natansohn |
| 3,576,756 | A | 4/1971 | Russo |
| 3,586,634 | A | 6/1971 | Avella |
| 5,917,935 | A | 6/1999 | Hawthorne et al. |
| 5,953,678 | A | 9/1999 | Genet et al. |
| 7,358,542 | B2 | 4/2008 | Radkov et al. |
| 7,497,973 | B2 | 3/2009 | Radkov et al. |
| 7,648,649 | B2 | 1/2010 | Radkov et al. |
| 7,655,156 | B2 | 2/2010 | Cheng et al. |
| 7,985,723 | B2 | 7/2011 | Savu et al. |
| 8,252,613 | B1 | 8/2012 | Lyons et al. |
| 8,329,485 | B2 | 12/2012 | McKean |
| 8,663,501 | B2 | 3/2014 | Srivastava et al. |
| 8,721,925 | B2 | 5/2014 | Winkler et al. |
| 8,785,222 | B2 | 7/2014 | McKean et al. |
| 8,906,724 | B2 | 12/2014 | Murphy et al. |
| 9,111,464 | B2 | 8/2015 | Bibl et al. |
| 9,222,017 | B2 | 12/2015 | Yoshida |
| 9,388,336 | B2 | 7/2016 | Murphy et al. |
| 9,512,356 | B2 | 12/2016 | Lyons et al. |
| 9,598,636 | B2 | 3/2017 | Kaneyoshi et al. |
| 9,627,437 | B1 | 4/2017 | Ulmer et al. |
| 9,698,314 | B2 | 7/2017 | Murphy et al. |
| 9,879,178 | B2 | 1/2018 | Jin et al. |
| 10,020,430 | B2 | 7/2018 | Nguyen et al. |
| 10,424,614 | B2 | 9/2019 | Schubert et al. |
| 10,600,939 | B2 | 3/2020 | Yuan et al. |
| 10,793,773 | B2 | 10/2020 | Du et al. |
| 2002/0195927 | A1 | 12/2002 | Groen et al. |
| 2003/0148695 | A1 | 8/2003 | Kawamura et al. |
| 2004/0144987 | A1 | 7/2004 | Ouderkirk et al. |
| 2004/0164277 | A1 | 8/2004 | Yen et al. |
| 2006/0012287 | A1 | 1/2006 | Tian et al. |
| 2007/0159060 | A1 | 7/2007 | Shimizu et al. |
| 2008/0111472 | A1 | 5/2008 | Liu et al. |
| 2009/0267485 | A1 | 10/2009 | Nagatomi et al. |
| 2009/0272996 | A1 | 11/2009 | Chakraborty |
| 2010/0142189 | A1 | 6/2010 | Hong et al. |
| 2010/0148193 | A1 | 6/2010 | Duong et al. |
| 2012/0064134 | A1 | 3/2012 | Bourke, Jr. et al. |
| 2012/0256125 | A1 | 10/2012 | Kaneyoshi et al. |
| 2012/0286208 | A1 | 11/2012 | McKean et al. |
| 2013/0130419 | A1 | 5/2013 | Phipps et al. |
| 2013/0148376 | A1 | 6/2013 | Nick et al. |
| 2013/0335000 | A1 | 12/2013 | Maier |
| 2014/0027673 | A1 | 1/2014 | Nick et al. |
| 2014/0120705 | A1 | 5/2014 | Rogojina |
| 2014/0272657 | A1 | 9/2014 | Milacic et al. |
| 2014/0339495 | A1 | 11/2014 | Bibl et al. |
| 2015/0008463 | A1 | 1/2015 | Yoshida |
| 2015/0076406 | A1 | 3/2015 | Zhou et al. |
| 2015/0301402 | A1 | 10/2015 | Kimura et al. |
| 2015/0329770 | A1 | 11/2015 | Kaneyoshi et al. |
| 2016/0024378 | A1 | 1/2016 | Murphy |
| 2016/0053170 | A1 | 2/2016 | Okura et al. |
| 2016/0244663 | A1 | 8/2016 | Murphy et al. |
| 2016/0289553 | A1 | 10/2016 | Beers et al. |
| 2016/0312114 | A1 | 10/2016 | Murphy et al. |
| 2016/0347998 | A1 | 12/2016 | Kaneyoshi |
| 2017/0073815 | A1 | 3/2017 | Patel et al. |
| 2017/0077360 | A1 | 3/2017 | Yang et al. |
| 2017/0130125 | A1 | 5/2017 | Shibamoto et al. |
| 2017/0153382 | A1 | 6/2017 | Wang et al. |
| 2017/0219184 | A1 | 8/2017 | Petluri et al. |
| 2017/0242303 | A1* | 8/2017 | Meyers .............. C09K 11/617 |
| 2017/0254943 | A1 | 9/2017 | Murphy |
| 2017/0276997 | A1 | 9/2017 | Yoshinaga |
| 2017/0329770 | A1 | 11/2017 | Kozak et al. |
| 2017/0342278 | A1 | 11/2017 | Zalich et al. |
| 2017/0342320 | A1 | 11/2017 | Tsumori et al. |
| 2018/0163126 | A1 | 6/2018 | Murphy et al. |
| 2018/0190827 | A1 | 7/2018 | Okazaki et al. |
| 2018/0208787 | A1 | 7/2018 | Tateishi et al. |
| 2018/0233632 | A1 | 8/2018 | Yuan et al. |
| 2018/0252967 | A1 | 9/2018 | Li et al. |
| 2018/0265778 | A1 | 9/2018 | Du et al. |
| 2019/0018273 | A1 | 1/2019 | Park et al. |
| 2019/0088827 | A1 | 3/2019 | Camardello et al. |
| 2019/0179016 | A1* | 6/2019 | Raring ................... F21V 29/70 |
| 2019/0280165 | A1 | 9/2019 | Camardello et al. |
| 2019/0292448 | A1 | 9/2019 | Porob et al. |
| 2019/0366847 | A1* | 12/2019 | Meyers ............ G02F 1/133609 |
| 2020/0028033 | A1 | 1/2020 | Camardello et al. |
| 2020/0287099 | A1 | 9/2020 | Camardello et al. |
| 2020/0299574 | A1 | 9/2020 | Hashizume |
| 2020/0301261 | A1 | 9/2020 | Hashizume |
| 2020/0304764 | A1 | 9/2020 | Hashizume |
| 2020/0369956 | A1 | 11/2020 | Butts et al. |
| 2021/0317326 | A1 | 10/2021 | Doherty et al. |
| 2023/0246013 | A1 | 8/2023 | Murphy et al. |

FOREIGN PATENT DOCUMENTS

| | | |
|---|---|---|
| CN | 113025329 A | 6/2021 |
| CN | 110546237 B | 3/2024 |
| DE | 2523933 A1 | 12/1976 |
| EP | 3045965 A1 | 7/2016 |
| EP | 3045965 B1 | 7/2016 |
| GB | 1174380 A | 12/1969 |
| JP | 2003336045 A | 11/2003 |
| JP | 5375733 B2 | 12/2013 |
| JP | 5884717 B2 | 3/2016 |
| KR | 20010004094 A | 1/2001 |
| KR | 20120095629 A | 8/2012 |
| TW | 200930793 A | 7/2009 |
| TW | 201727336 A | 8/2017 |
| TW | 201920607 A | 6/2019 |
| TW | 201921731 A | 6/2019 |
| WO | 2010074963 A1 | 7/2010 |
| WO | 2013121355 A1 | 8/2013 |
| WO | 2014146748 A1 | 9/2014 |
| WO | 2016186637 A1 | 11/2016 |
| WO | 2017073815 A1 | 5/2017 |
| WO | 2018093832 A2 | 5/2018 |
| WO | 2018185116 A2 | 10/2018 |
| WO | 2018190827 A1 | 10/2018 |
| WO | 2019173025 A1 | 9/2019 |
| WO | 2021211600 A1 | 10/2021 |

OTHER PUBLICATIONS

Ji Hye Oh et al., "Analysis of wide color gamut of green/red bilayered freestanding phosphor film-capped white LEDs for LCD backlight", Optics Express, Jun. 4, 2015, pp. 1-14.

(56) References Cited

OTHER PUBLICATIONS

Ziyang Hou et al., "A Green synthetic route to the highly efficient K2SiF6: Mn4+ narrow-band red phosphor for warm white light-emitting diodes", Journal of Materials Chemistry C, vol. 6, No. 11, Jan. 1, 2018, pp. 2741-2746.
Douglas Naab et al., "GE K2SiF6: Mn4+ (PFS/KSF) Phosphor: Market Leading Wide Color Gamut Technology & Path Towards Enabling Next Generation Displays", May 5, 2019, pp. 1-13.
EP Third Party Submission, Publication No. Application No. 20210788285, dated Nov. 11, 2023, 5 pps.
Luminescence of Barium Uranyl Phosphate, G. Blasse et al., J.Inorg. Nucl. Chem., vol. 40, pp. 2037-2039.
PCT International Search Report, Application No. PCT/US2022/024577, dated Aug. 3, 2022, 5 pages.
Taiwanese Office Action dated Apr. 30, 2024 for TW App. No. 110113479 (pp. 1-12).
Taikar et al., "SrO: U6+ green light emitting phosphor", Journal of Luminescence, Elsevier, Science direct, 153, 2014, pp. 304-306.
Worku, Michael et al., "Sunlike White-Light-Emitting Diodes Based on Zero-Dimensional Organic Metal Halide Hybrids", ACS Applied Materials & Interfaces, 2018, 10 (36), 30051-30057, DOI: 10.1021/acsami.8b12474.
Wu, Yuying et al., "New photoluminescence hybrid perovskites with ultrahigh photoluminescence quantum yield and ultrahigh thermostability temperature up to 600 K", Nano Energy, vol. 77, 2020, 105170, ISSN 2211-2855, https://doi.org/10.1016/j.nanoen.2020.105170.
Zhou, Tingting et al., "P-92: Fabrication and Patterning of a Wide-Color-Gamut Color Filter Based on Quantum Dots", 2016, SID Symposium Digest of Technical Papers, 47, 1469-1471, 10.1002/sdtp.10945.
Shijun Wu et al., High Distorted Uranyl Ion Coordination and One/Two-Dimensional Structural Relationship in the Ba2[UO2(TO4)2] (T=P, As) System: An Experimental and Computational Study, Inorganic Chemistry, Jul. 3, 2014, vol. 53, pp. 7650-7660.
Alekseev, Evgeny V. et al., 'Complex topology of uranyl polyphosphate frameworks: crystal structures of $\alpha$-, $\beta$-K[(UO2)(P309)] and K[(UO2)2(P3O10)].' Z. Anorg. Allg. Chem., Jun. 10, 2008, vol. 634, No. 9, pp. 1527-1532.
International Search Report and Written Opinion for International Application No. PCT/US2022/024577, dated Mar. 8, 2022, 9 pages.
Phosphor Film—Contribute to High Efficiency and Thinner Liquid Crystal Display with Backlight Using Mini LED, White Paper for PS Series, dated Sep. 2022.
Pro Display XDR Technology Overview, White Paper, dated Feb. 2020.
Chinese Office Action dated Aug. 1, 2023 for CN App. No. 202180042076.9 (pp. 1-16).
PCT International Search Report, Application No. PCT/US2022/077858, dated Feb. 7, 2023, 13 pages.
Allpress "The crystal structure of caesium uranyl oxychloride Csx(UO2)OClx (x approximately 0.9)", Published 1964 in "Acta Crystallographica", 17, 41-46 (Year: 1964).
Anonymous, "Compreignactie ", (Aug. 11, 2016), pp. 1-3, fluomin, URL: http://www.fluomin.org/uk/fiche.php?id=1008, XP055738271.
Anonymous, "Dumontite", (Aug. 12, 2016), pp. 1-2, fluomin, URL: http://www.fluomin.org/uk/fiche.php?id=325, XP055738275.
Anonymous, "Renardite", (Aug. 12, 2016), pp. 1-2, fluomin, URL: http://www.fluomin.org/uk/fiche.php? id=868&name=renardite, XP055738269.
Anonymous, "Sodium-zippeite ", (Aug. 11, 2016), pp. 1-3, fluomin, URL: http://www.fluomin.org/uk/fiche.php?id=674, XP055738273.
Braun, David D et al., "Rheology Modifiers Handbook: Practical Use and Application", Part 2, pp. 71-191, Elsevier, 2013 (ISBN:0-8155-1441-7).
Cai, Xing-Wei et al., "Lead-free/rare earth-free Green-light-emitting crystal based on organic-inorganic hybrid [(C10H16N)2][MnBr4] with high emissive quantum yields and large crystal size", Journal of Molecular Structure, vol. 1161, 2018, pp. 262-266, ISSN 0022-2860, https://doi.org/10.1016/j.molstruc.2018.01.093.
Chukanov et al., "Chistyakovaite, a new mineral Al(UO2)2(AsO4)2(F,OH)•6.5H20", Doklady Earth Sciences, (Feb. 28, 2006), vol. 407, No. 2, ISSN 1531-8354, pp. 290-293, XP019316270.
Chukanov et al., "Larisaite, Na(H3O)(UO2)3(SeO3)202 -4H20, a new uranyl selenite mineral from Repete mine, San Juan County, Utah, USA", European Journal of Mineralogy, (Jan. 1, 2004), vol. 16, No. 2, doi:10.1127/0935-1221/2004/0016-0367, ISSN 0935-1221, pp. 367-374, XP055738278.
Derby, Brian, "Inkjet Printing Ceramics: From Drops to Solid", 2011, Journal of The European Ceramic Society—J Eur Ceram Soc, 31, 2543-2550, 10.1016/j.jeurceramsoc.2011.01.016.
Gong, Liaokuo et al., "Efficient modulation of photoluminescence by hydrogen bonding interactions among inorganic [MnBr4]2- anions and organic cations", 2019, Chemical Communications, 55 (51), 10.1039/C9CC03038G.
Gough et al., "Multi-Photon Phosphor Feasibility Research", Advanced Light Source Development U.S. Dept. of Energy Contract with EPRI: DE-FC26-00NT40987 Reporting Period Oct. 1, 2000 to Mar. 31, 2002; Final Report, May 2003.
Huang et al., "Highly stable K2SiF6: Mn4+K2SiF6 composite phosphor with narrow red emission for white LEDs.", ACS applied materials & interfaces, 2018, vol. 10, No. 21, pp. 18082-18092, <doi: 10.1021/acsami.8b03893>.
International Search Report and Written Opinion of the International Searching Authority, PCT/US2019/017606, May 27, 2019.
International Search Report and Written Opinion of the International Searching Authority, PCT/US2020/028946, Aug. 10, 2020.
International Search Report and Written Opinion of the International Searching Authority, PCT/US2021/013963, May 12, 2021.
International Search Report and Written Opinion of the International Searching Authority, PCT/US2021/027105 dated Jul. 30, 2021.
Kikuyama et al., Surface Active Buffered Hydrogen Fluoride Having Excellent Wettability for ULSI Processing, IEEE Transactions on Semiconductor Manufacturing, vol. 3, No. 3, Aug. 1990, pp. 99-108.
Kumar et al., "On the photo and thermally stimulated luminescence properties of U doped SrBPO5", Materials Research Bulletin, vol. 60, Dec. 2014, 7 Pages.
Lee, Ernest et al., "Quantum Dot Conversion Layers Through Inkjet Printing", Nanosys, Inc., Milpitas, CA, May 21, 2018, 4 pages.
Liu, Yuanyuan et al., "Experimental study of the parameters for stable drop-on-demand inkjet performance", Physics of Fluids, 31, Mar. 2004 (2019) https://doi.org/10.1063/1.5085868.
M. V. Hoffman, "Fluorescence and Energy Transfer in SrZnP2 07. UO2", J. Electrochem. Soc.: Solid State Science, Feb. 1970, No. 2, vol. 117, 6 Pages.
Mao, Wenhui et al., "Synthesis, crystal structure, photoluminescence properties of organic-inorganic hybrid materials based on ethylenediamine bromide", Journal of Saudi Chemical Society, vol. 24, Issue 1, 2020, pp. 52-60, ISSN 1319-6103, https://doi.org/10.1016/j.jscs.2019.09.003.
Mikolajek, Morten et al., "Requirements to Ceramic Suspensions for Inkjet Printing", 2015, Ceramic Forum International, 92, E25-29.
Morad, Viktoriia et al., "Manganese(II) in Tetrahedral Halide Environment: Factors Governing Bright Green Luminescence", Chemistry of Materials, 2019, 31 (24), 10161-10169, DOI: 10.1021/acs.chemmater.9b03782.
Morrison et al., "Flux versus Hydrothermal Growth: Polymorphism of A2(UO2)Si2O6 (A=Rb, Cs)", Inorganic chemistry, 2017, vol. 56, pp. 1053-1056.
Nguyen et al., "Waterproof Alkyl Phosphate Coated Fluoride Phosphors for Optoelectronic Materials", Angewandte Communications, International Edition vol. 54, 2015, p. 10865-10866.
Nichols et al., "Fluorescence of the Uranyl Salts", Published in 1919 by The Carnegie Institution of Washington (Year: 1919).
Onac et al., "Hydrothermal Genesis of Metatyuyamunite, Ca(UO2)2(VO4)2•3-5H2O in the Valea Rea Cave, Romania", 13th International Congress of Speleology 4th Speleological Congress of

(56) References Cited

OTHER PUBLICATIONS

Latin América and Caribbean 26th Brazilian Congress of Speleology, (Jul. 22 2001), pp. 25-30, XP055637609.

Ondruš et al., "Cejkaite, the triclinic polymorph of Na4(UO2)(CO3)3—A new mineral from Jachymov, Czech Republic", American Mineralogist, (Apr. 31, 2003), vol. 88, No. 4, doi:10.2138/am-2003-0422, ISSN 0003-004X, pp. 686-693, XP055637612.

Pekov et al., "Beshtauite, (NH4)2(UO2)(SO4)2 . 2H2O, a new mineral from Mount Beshtau, Northern Caucasus, Russia", American Mineralogist, (Aug. 31, 2014), vol. 99, No. 8-9, doi:10.2138/am.2014.4870OLITCiteNPL, ISSN 0003-004X, pp. 1783-1787, XP009523386.

Plasil et al., "Adolfpateraite, K(UO2)(SO4)(OH)(H2O), a new uranyl sulphate mineral from Jachymov", American Mineralogist, Czech Republic, (2012), vol. 97, No. 2-3, doi: 10.2138/am.2012.3976, pp. 447-454, XP009523379.

Pote et al., "Preparation of CaF2: U Phosphor by Solid State Metathesis Reaction", International Journal of Self-Propagating High-Temperature Synthesis, 2013, vol. 22, No. 1, pp. 37-40.

Qin, Yanyan et al., "Luminescent manganese(II) complexes: Synthesis, properties and optoelectronic applications", Coordination Chemistry Reviews, vol. 416, 2020, 213331, ISSN 0010-8545, https://doi.org/10.1016/j.ccr.2020.213331.

R.F. Vochten, et al., "Transformation of chernikovite into meta-uranocircite II, Ba(UO2)2(PO4)2.6H2", Published Sep. 1992, in Mineralogical Magazine, vol. 56, pp. 367-372.

Rabinowitch, "Spectroscopy and Photochemistry of Uranyl Compounds", Published Jan. 1, 1964, 1st Edition, The MacMillian Company, New York, pp. 47, 57, & 58 (Year: 1964).

Read et al., "Crystal growth, structural characterization, cation-cation interaction classification, and optical properties of uranium(VI) containing oxychlorides, A4U5O16Cl2 (A = K, Rb), Cs5U7O22Cl3, and AUO3Cl (A = Rb, Cs)", Published Apr. 7, 2014 in "CrystEngComm", 2014, 16, 7259-7267.

Read, Cory Michael, "Discovery of novel uranium-containing oxides and related materials by flux crystal growth", University of South Carolina 2015, pp. 1-258.

Rout et al., "Uranium speciation and its site occupancy in alkaline-earth borophosphates", Journal of the American Ceramic Society, vol. 100, No. 7, Apr. 3, 2017 (Apr. 3, 2017), pp. 2921-2931, XP055810229, ISSN: 0002-7820, DOI: 10.1111/jace.14800, Retrieved from the internet: URL: https://api.wiley.com/onlinelibrary/tdm/v1/articles/10.1111%2Fjace.14800>.

Sijbom et al., "K_2SiF_6:Mn4+ as a red phosphor for displays and warm-white LEDs: a review of properties and perspectives", Optical Materials Express, vol. 7, No. 9, Aug. 24, 2017 (Aug. 24, 2017), pp. 3332-3365, XP055810315, DOI: DirectPDFAccess/32562ED4-D5B4-A705-8BEB3A3D3B44F39F_371019/0me-7-9-3332.pdf?da=1&id=371019&seq=0&mobile=no>.

Slattery, "Uranium as an Activator-II", Published in 1929 by Journal of the Optical Society of America, vol. 19, Issue 4, pp. 175-186 (Year: 1929).

Murphy, James, "GE TriGain (TM): Commercialized, Narrow Band, Red Emitting Phosphors for LED Lighting and WCG Display Applications" Presentation, SID 2017; 19 pp.

Murphy, James, "GE RadiantRed (TM) Technology & TriGain (TM) Phosphors for Wide Color Gamut Displays" Presentation, SID 2018; 12 pp.

Murphy, James, "Market Leading Wide Color Gamut, Narrow-Band Phosphors by GE & Path Towards Enabling Next Generation Displays" Presentation, SID 2020; 26 pp.

\* cited by examiner

DEVICES COMPATIBLE WITH NIGHT VISION EQUIPMENT

CROSS-REFERENCE TO RELATED APPLICATION

This application is a continuation of copending International Application No. PCT/US2021/048535 filed Aug. 31, 2021, which claims the benefit of priority to U.S. Provisional Patent Application Ser. No. 63/073,386 filed Sep. 1, 2020 for "DEVICES COMPATIBLE WITH NIGHT VISION EQUIPMENT"; and is a continuation-in-part of to International Application Number PCT/US2021/027105 filed Apr. 13, 2021 for "GREEN-EMITTING PHOSPHORS AND DEVICES THEREOF", each of which is hereby incorporated by reference in its entirety.

BACKGROUND

The field of the invention relates generally to devices and more particularly, to devices compatible with night vision equipment.

Displays are widely used to allow for the conversion of electrical signals into images. Such images are typically in color wherein the photoluminescence materials generate a light signal in response to radiation excitation from a backlight. The visible region of the electromagnetic spectrum that is viewable by the naked eye ranges from about 400 nanometers (nm) to about 700 nm.

Liquid crystal displays (LCDs) are widely used to provide the displays in many applications. The LCD is typically formed from an array of pixels formed from individual liquid crystal cells. For a color LCD, each pixel contains three sub-pixels comprised of red, green and blue. By varying the intensity of these RGB sub-pixels and through the use of color filters, the color images are displayed.

Light emitting diodes (LEDs) are another display technology that uses a pn-junction diode to emit light when activated through electroluminescence. The color of the light corresponds to the energy of photon in accordance with the energy band gap of the semiconductor material. One particular implementation of LED displays is for backlit LCD displays. One application of such displays is for use in darkened or dimly lit environments where night vision gear or equipment is deployed.

Night vision equipment is used in a variety of applications such as for military, law enforcement, and emergency situations, as well as recreational applications, such as animal watching and hunting. Some examples include vehicle operation where night vision gear is worn to see the external environment and where instrument displays also need to be viewed. Such vehicles include aircraft, helicopters, tanks, trains, and ships. Night vision goggles and night vision imaging systems heads-up displays are examples of viewing devices that are used for night vision usage.

In a conventional implementation, the night vision equipment amplifies the red and near infrared (near-IR) light and projects this light on a green phosphor display. The current generation of night vision goggles enhances visibility to the level necessary for night time operations through increased sensitivity in the red and near IR spectrums from approximately 630 nm to 930 nm.

Conventional systems for backlighting displays are typically designed for brightness and contrast for daylight conditions. The brightness of the conventional display negatively interferes with the night vision equipment and may also cause eye discomfort to the user. Typical LCD displays emit light from the blue to the red end of the spectrum. Light emitted by the display in the red end of the spectrum from 650 to 900 nm will interfere with the operation of night vision equipment, since the night vision equipment is sensitive to those wavelengths. If the night vision equipment is used when such displays are active, the night vision equipment will bloom, or display an all-white image, independent of the outside scene.

One of the important uses of night vision gear relates to defense vehicles. For example, during nighttime operations on a plane, train, ship or helicopter, the user has instrument displays that are used in the operation of the vehicles, but also requires night vision equipment to identify location and targets.

The illumination of some instrument displays, such as cockpit displays, generates enough energy (near-IR radiation) in the night vision goggle response spectrum to bloom and saturate the display, thereby rendering the whole scene bright white and causing the night vision goggles to become unusable. The U.S. government has established specifications such as MIL-STD-3009 with requirements for NVIS (night vision imaging system) compatible aircraft interior lighting. There are two general types of night vision goggles, namely Type I and Type II, with comparable response spectrum and sensitivity. The Type I NVIS system uses Generation III image intensifier tubes to display the image on a phosphor screen in the users direct line of sight, whereas the Type II NVIS projects the image on a transparent medium in the users line of sight (similar to standard heads-up display technology). The Type II configuration allows for simultaneous viewing of the intensified image and the cockpit displays. The Type I goggle user must look below the goggles' display in order to use the control instruments.

One conventional solution is to filter the instrument display so that the display emits the necessary light for proper operation in both day and night environments while attenuating levels of the respective far red and near-IR radiation. The typical Type I and Type II goggles are equipped with a minus blue filter for heavy suppression of the visual spectrum before the radiation can reach image intensifier tubes. There are two minus blue filters available (Class A and Class B)-long pass filters with a Tp at 625 nm and 665 nm, respectively. The Class B filter lets less of the visual red spectrum pass; therefore, Class B NVIS is compatible with red cockpit lighting and the Class A systems have a spectrum overlap and cannot be used with the NVIS red lighting. The filters are designed for the specific application and more general applications are not supported.

Some known systems use filter screens that are placed over the display to filter out the far red and near infrared (NIR) light and reduce this light to a level that is acceptable with the night vision gear. Other applications use multiple imaging channels, such as dual channel displays or multi-channel displays. Each channel operates at a specified waveband and the operator or pilot selects the appropriate display for the lighting environment. For example, a dual channel display or dual mode display includes a bright daytime mode and a night vision equipment compatible mode for use at night or in low-light conditions. The night vision equipment compatible mode uses high levels of near infrared (IR) filtering, which results in significantly reduced brightness and lower quality displays. Dual mode or multi-channel displays are thicker and heavier due to the use of NVIS filters, more complex and more costly.

Filters are an additional cost to the night vision gear, add complexity and weight to the night vision gear, as well as another potential source of failure for the night vision gear. Additionally, having a filter added to the night vision gear can reduce the contrast of the display as seen by the operators due to secondary reflections from the filter glass. Additionally, the electronics continue to output the same intensity level even though the light is filtered and represents a loss of efficiency. This also consumes more power and generates heat that has to be dissipated.

Other implementations have been considered for providing backlit displays with low intensity levels that allow for use of night vision equipment. According to one example, the light sources were specifically designed solely with low intensity sources and only used in dark environments. This limits the usefulness of the display since the display does not have adequate brightness for a user in daytime use or when night vision gear is not being used.

BRIEF DESCRIPTION

Briefly, in one aspect, the present disclosure relates to a device used in conjunction with night vision equipment. The device including an LED light source optically coupled and/or radiationally connected to a phosphor material including a green-emitting phosphor and a red-emitting phosphor of formula I:

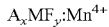

$$A_xMF_y:Mn^{4+} \qquad I$$

wherein A is Li, Na, K, Rb, Cs, or a combination thereof; M is Si, Ge, Sn, Ti, Zr, Al, Ga, In, Sc, Hf, Y, La, Nb, Ta, Bi, Gd, or a combination thereof; x is an absolute value of a charge of the $MF_y$ ion; and y is 5, 6 or 7. The device limits emission of wavelengths longer than 650 nm to less than 1.75% of total emission.

In another aspect, the present disclosure relates to a device used in conjunction with night vision equipment, where the device includes an LED light source optically coupled and/or radiationally connected to a phosphor material including a red-emitting phosphor having the formula $Na_2SiF_6:Mn^{4+}$. The device limits emission of wavelengths longer than 650 nm to no more than 1.0% of total emission.

Another aspect is a lighting apparatus including the device. Yet another aspect is a backlight apparatus including the device. Another aspect is a display including a lighting apparatus or backlight apparatus.

BRIEF DESCRIPTION OF THE DRAWINGS

These and other features, aspects and advantages of the present disclosure will become better understood when the following detailed description is read with reference to the accompanying drawings in which like characters represent like parts throughout the drawings, wherein.

Figure 1:
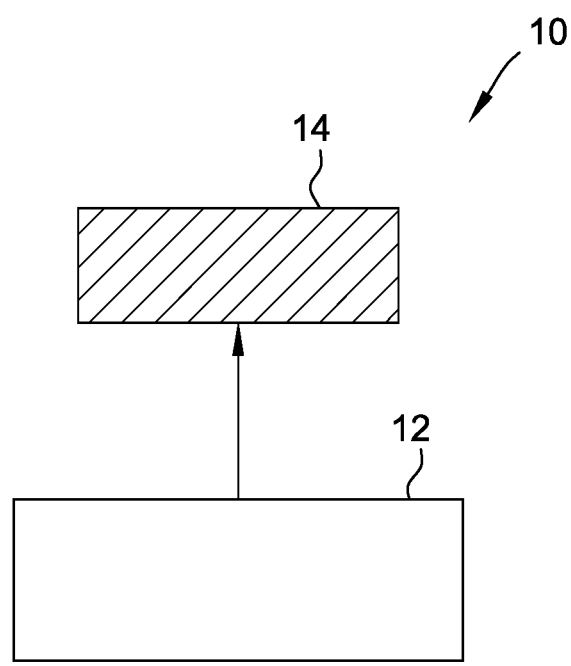
FIG. 1 is a schematic of a device, in accordance with one embodiment of the disclosure.

Unless otherwise indicated, the drawings provided herein are meant to illustrate features of embodiments of the disclosure. These features are believed to be applicable in a wide variety of systems comprising one or more embodiments of the disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise. As used herein, the term "or" is not meant to be exclusive and refers to at least one of the referenced components being present and includes instances in which a combination of the referenced components may be present, unless the context clearly dictates otherwise.

Approximating language, as used herein throughout the specification and claims, may be applied to modify any quantitative representation that could permissibly vary without resulting in a change in the basic function to which it is related. Accordingly, a value modified by a term or terms, such as "about," "substantially," and "approximately," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. All references are incorporated herein by reference.

Near-IR spectrum is a term well-known in the art and generally refers to infrared light having wavelengths in the shorter wavelengths of radiation in the infrared spectrum and close to those of visible light. Specifically, it covers wavelengths from 700 to 1000 nm. It is desirable for use with night vision equipment to minimize emission at wavelengths of 665 nm and higher and 650 nm and higher.

Day lighting or day mode is lighting associated with high brightness illumination levels and high blue content, such as daytime.

Night lighting or night mode is lighting associated with low light levels or reduced visibility conditions, such as nighttime, smoke, fog, adverse weather, and similar conditions. In one embodiment, the present disclosure relates to a device used in conjunction with night vision equipment where the device includes an LED light source radiationally connected and/or optically coupled to a phosphor material including a green-emitting phosphor and a red-emitting phosphor of formula I:

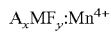

$$A_xMF_y:Mn^{4+} \qquad \text{I}$$

wherein A is Li, Na, K, Rb, Cs, or a combination thereof, M is Si, Ge, Sn, Ti, Zr, Al, Ga, In, Sc, Hf, Y, La, Nb, Ta, Bi, Gd, or a combination thereof, x is an absolute value of a charge of the $MF_y$ ion; and y is 5, 6 or 7. The device limits emission of wavelengths longer than 650 nm to less than 1.75% of total emission.

Devices or LED packages according to the present disclosure include an LED light source optically coupled and/or radiationally connected to a phosphor material. FIG. 1 shows a device 10, according to one embodiment of the present disclosure. The device 10 includes an LED light source 12 and a phosphor material 14. The LED light source 12 may comprise a UV or blue emitting LED. In some embodiments, the LED light source 12 produces blue light in a wavelength range from about 440 nm to about 460 nm. In the device 10, the phosphor material 14 is optically coupled and/or radiationally connected to the LED light source 12. Optically coupled or radiationally connected means that radiation from the LED light source 12 is able to excite the phosphor material 14, and the phosphor material 14 is able to emit light in response to the excitation by the radiation. The phosphor material 14 may be disposed on a portion of the LED light source 12 or located remotely at a distance from the LED light source 12.

In some embodiments, the device 10 may be a backlight unit for display applications. In these embodiments, the phosphor material 14 may be present in the form of a film, sheet or strip that is mounted or disposed on a surface of the LED light source 12. LED backlight units (BLU) for use in displays may be based on a combination of a blue or UV LED, a green phosphor and a red phosphor to provide a white (D65 color point) light.

The device has minimal emission in the near-IR range beyond a 650 nm wavelength and is compliant with night vision imaging system (NVIS) standards. The device is compatible with night vision equipment and avoids saturating night vision equipment.

Figure 2:
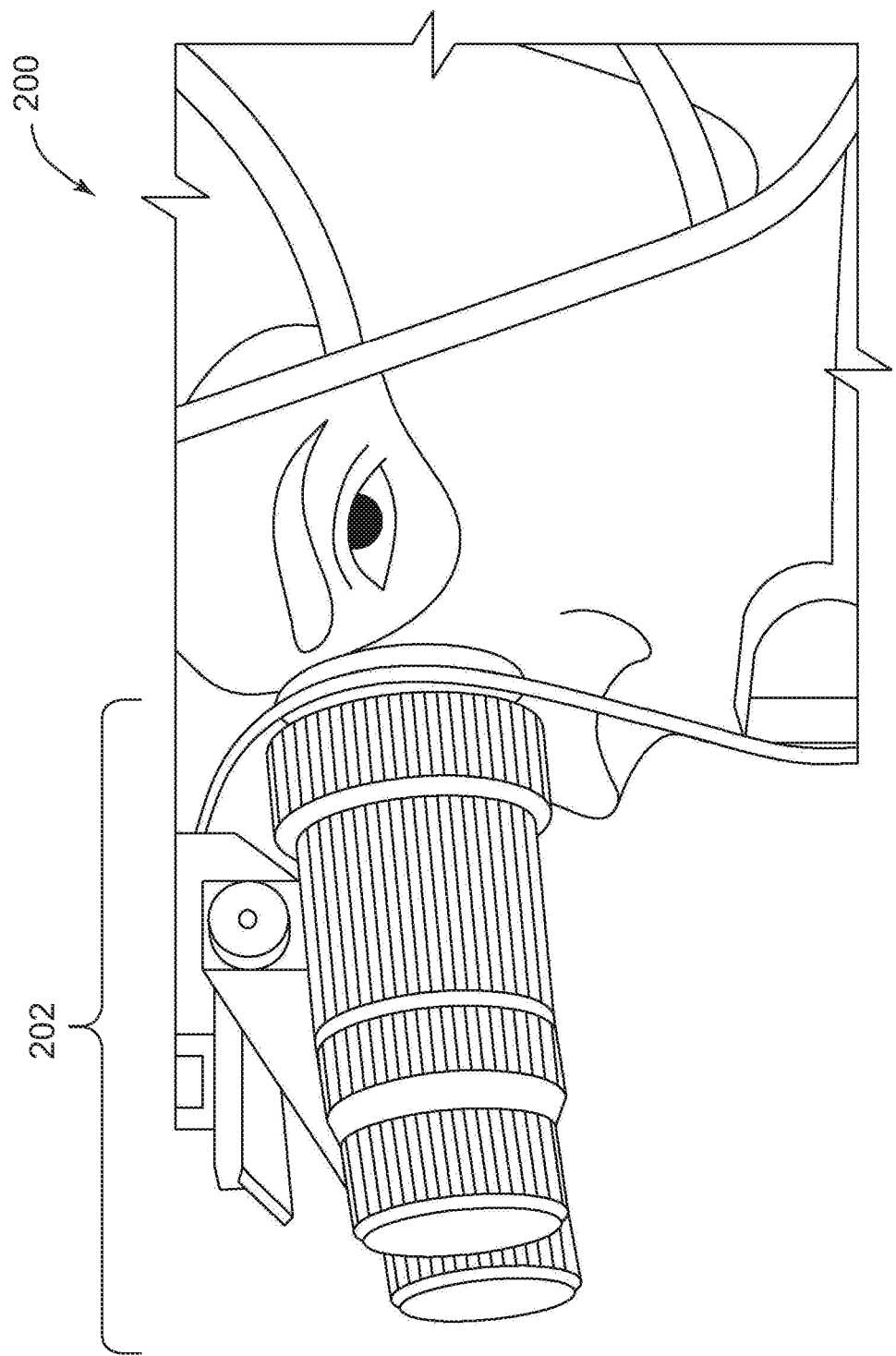
FIG. 2 is a perspective view of an operator using night vision equipment to view objects during low-light conditions in accordance with one embodiment of the disclosure.

FIG. 2 illustrates a perspective view of an operator 200 using night vision equipment 202 to view objects during low-light or reduced visibility conditions, such as nighttime, smoke, fog, adverse weather, and similar conditions.

The night vision equipment or gear 202 can represent night vision goggles, night vision imaging systems heads-up displays or other equipment that collect and amplify low levels of light so that the operator 200 can view objects in the low-light conditions. The night vision gear 202 may be deployed as headgear to permit the operator 200 to see despite the limited light conditions. Night vision goggles may be night vision sights or scopes, optical oculars, monoculars, or binoculars, hand-held or head-mounted. Night vision goggles for airborne applications may be a direct image type (Type I) or a projected image type (Type II).

The device or backlight unit is compatible with night vision equipment by limiting the emission of wavelengths that are longer than 650 nm to less than 1.75% of the total emission. In another embodiment, the device limits the emission of wavelengths longer than 650 nm to no more than 1.5%. In another embodiment, the device limits the emission of wavelengths longer than 650 nm to no more than 1.3%. In another embodiment, the device limits emission of wavelengths longer than 650 nm to no more than 1.0% total emission. In another embodiment, the device limits emission of wavelengths longer than 650 nm to less than 1.0% total emission. In another embodiment, the device limits emission of wavelengths longer than 650 nm to no more than 0.95% total emission. In another embodiment, the device limits emission of wavelengths longer than 650 nm to no more than 0.9% total emission. In another embodiment, the device limits emission of wavelengths longer than 650 nm to no more than 0.8% total emission. In another embodiment, the device limits emission of wavelengths longer than 650 nm to no more than 0.75% total emission. In another embodiment, the device limits emission of wavelengths longer than 650 nm to no more than 0.5% total emission. In another embodiment, the device limits emission of wavelengths longer than 650 nm to no more than 0.4% total emission.

In another embodiment, the device has minimal emission at 665 nm and higher wavelengths. In one embodiment, the device has no more than 0.6% emission at wavelengths of 665 nm or longer. In another embodiment, the device has less than 0.5% emission at wavelengths of 665 nm or longer. In another embodiment, the device has less than 0.25% emission at wavelengths of 665 nm or longer. In another embodiment, the device has no more than 0.20% emission at wavelengths of 665 nm or longer. In another embodiment, the device has less than 0.20% emission at wavelengths of 665 nm or longer. In another embodiment, the device has less than 0.15% emission at wavelengths of 665 nm or longer. The percent (%) emissions are based on total emission of the device.

The LED light source 12 may be an inorganic LED light source or an organic LED light source. The term 'LED light source', as used herein, is meant to encompass all LED light sources such as semiconductor laser diodes (LD), inorganic light emitting diodes, organic light emitting diodes (OLED) or a hybrid of LED and LD. In addition, the LED light source may be a chip CSP (chip scale package), miniLED, or microLED, which may be used in self-emissive displays. Further, it should be understood that the LED light source may be replaced, supplemented or augmented by another radiation source unless otherwise noted and that any reference to semiconductor, semiconductor LED, or LED chip is merely representative of any appropriate radiation source, including, but not limited to, LDs and OLEDs.

The phosphor material 14 is optically coupled and/or radiationally connected to the LED light source 12 and includes a green-emitting phosphor as described herein and a red-emitting phosphor of formula I as described herein. In one embodiment, the LED light source 12 is a UV LED producing UV light. In one embodiment, the LED light source 12 is a blue LED producing blue light and the combination of the blue LED with the phosphor material 14 including a green-emitting phosphor and a red-emitting phosphor produces a white light from the device.

The green-emitting phosphors absorb radiation in the UV, near-UV or blue region (a wavelength range between about 400 nm and 470 nm) and emit in a narrow band with a main emission peak centered at a wavelength range between 500 nm and 540 nm, particularly from about 510 nm to about 540 nm, and more particularly from about 520 nm to about 538 nm. In another embodiment, the green phosphor has a peak with a full width at half max (FWHM) measurement of 45 nm or less. In another embodiment, the green phosphor has an FWHM at no more than 35 nm. In another embodiment, the green phosphor has an FWHM in a range from about 32 nm to about 35 nm. In one embodiment, the green-emitting phosphor has an emission tail that does not extend beyond 645 nm. In some embodiments, the green-emitting phosphors when incorporated into a display produce a much larger gamut, according to NTSC, DCI-P3, Adobe or BT2020 standards, relative to phosphors that have a relatively wide-band emission.

In one embodiment, the green-emitting phosphors may be a sulfide phosphor or a uranium-doped phosphor or U-doped phosphor. Suitable green-emitting phosphors are described in International Publication No. WO 2019/060055, International Publication No. WO 2019/173024, International Publication No. WO 2019/173025, and International Application No. PCT/US21/27105 filed Apr. 13, 2021, the entire contents of each of which are incorporated herein by reference.

In one embodiment, the green-emitting phosphors may be $[Ba_{1-a-b}Sr_aCa_b]_x[Mg,Zn]_y(UO_2)_z([P,V]O_4)_{2(x+y+z)/3}$, where $0 \leq a \leq 1$, $0 \leq b \leq 1$, $0.75 \leq x \leq 1.25$, $0.75 \leq y \leq 1.25$, $0.75 \leq z \leq 1.25$; and $[Ba,Sr,Ca]_p(UO_2)_q[P,V]_rO_{(2p+2q+5r)/2}$, where $2.5 \leq p \leq 3.5$, $1.75 \leq q \leq 2.25$, $3.5 \leq r \leq 4.5$.

In another embodiment, the green-emitting phosphor may have formula $[Ba_x[Mg,Zn]_y(UO_2)_z[PO_4]_{2(x+y+z)/3}$, where $0.75 \leq x \leq 1.25$, $0.75 \leq y \leq 1.25$, $0.75 \leq z \leq 1.25$. In another embodiment, the green-emitting phosphor may have formula $Ba[Mg,Zn]UO_2(PO_4)_2$.

In one embodiment, the green-emitting phosphors may be selected from phosphors of formula $\gamma\text{-}Ba_2UO_2(PO_4)_2$, $Ba[Mg,Zn](UO_2)(PO_4)_2$, $Ba_6Al_5P_5O_{26}{:}U^{6+}$, $Ba(UO_2)_2P_2O_7$, $BaMgUO_2(PO_4)_2$, $BaZnUO_2(PO_4)_2$, $Ba_3(PO_4)_2(UO_2)_2P_2O_7$, $Ba_2Sr(PO_4)_2(UO_2)_2P_2O_7$, $BaSr_2(PO_4)_2(UO_2)_2P_2O_7$, $Sr_3(PO_4)_2(UO_2)_2P_2O_7$, $Ca_3(PO_4)_2(UO_2)_2P_2O_7$, $BaMg_2(PO_4)_2(UO_2)_2P_2O_7$, $Ba_2Mg(PO_4)_2(UO_2)_2P_2O_7$, $Ba_2UO_2(VO_4)_2$, $RbMgPO_4{:}U^{6+}$, $BaZn_2(PO_4)_2{:}U^{6+}$, $BaBPO_5{:}U^{6+}$, $Sr_3B_2O_6{:}U^{6+}$, $Ba_2UO_2(PO_4)_2{:}Eu^{3+}$ and $Ba_3(UO_2)_2P_2O_7(PO_4)_2$.

In some embodiments, the phosphors contain phosphate/vanadate groups, and are of formula $[Ba_{1-a-b}Sr_aCa_b]_x[Mg,Zn]_y(UO_2)_z([P,V]O_4)_{2(x+y+z)/3}$, where $0 \leq a \leq 1$, $0 \leq b \leq 1$, $0.75 \leq x \leq 1.25$, $0.75 \leq y \leq 1.25$, $0.75 \leq z \leq 1.25$. In particular, the phosphors contain phosphate groups, and are of formula $[Ba_x[Mg,Zn]_y(UO_2)_z[PO_4]_{2(x+y+z)/3}$. Particular examples include $Ba[Mg,Zn]UO_2(PO_4)_2$, more particularly $BaMgUO_2(PO_4)_2$ and $BaZnUO_2(PO_4)_2$.

In other embodiments, the phosphors contain $[P,V]_2O_7$ groups in addition to phosphate/vanadate groups, and are of formula $[Ba,Sr,Ca,Mg,Zn]_p(UO_2)_q[P,V]_rO_{(2p+2q+5r)/2}$, where $2.5 \leq p \leq 3.5$, $1.75 \leq q \leq 2.25$, $3.5 \leq r \leq 4.5$. In particular, the phosphors contain phosphate and pyrophosphate groups, and are of formula $Ba_p(UO_2)_qP_rO_{(2p+2q+5r)/2}$. Examples include gamma barium uranyl phosphate or gamma barium uranyl orthophosphate ($\gamma\text{-}Ba_2UO_2(PO_4)_2$) and $Ba_3(PO_4)_2(UO_2)_2P_2O_7$.

In some embodiments, one or more additional activator ions may be present, such as $Mn^{2+}$, $Mn^{4+}$, $Ce^{3+}$, $Cr^{3+}$, $Eu^{2+}$ or $Eu^{3+}$.

Each formula of the green-emitting $U^{6+}$-doped phosphor may represent various compositions. The square brackets in the formulas indicate that at least one of the elements within the brackets is present in the phosphor composition and any combination of two or more thereof may be present, as limited by the stoichiometry of the composition. For example, in the phosphor of formula $[Ba_{1-a-b}Sr_aCa_b]_x[Mg,Zn]_y(UO_2)_z([P,V]O_4)_{2(x+y+z)/3}$, the notation $[Ba_{1-a-b}Sr_aCa_b]$ means that the phosphor contains Ba, and may contain Sr or Ca, or any combination of Sr or Ca, specifically, Ba only, or Ba and Sr, or Ba and Ca, or Ba, Sr and Ca. The notation [Mg, Zn] means that the phosphor also includes Mg or Zn, or a combination thereof and the notation [P, V] means that the phosphor includes P or V, or a combination thereof, in addition to $(UO_2)^{2+}$. Examples include $BaMgUO_2(PO_4)_2$ and $BaZnUO_2(PO_4)_2$. Furthermore, the compositions with $U^{6+}$ after the colon ":" in the formulas indicates that the phosphor compositions are doped with $U^{6+}$ and may be referred to as $U^{6+}$-doped phosphor. The term 'U-doped' typically indicates that a relatively small number of uranium atoms is substituted in the host lattice. In many compounds the uranium is present in the host lattice as the uranyl ion $(UO_2)^{2-}$. Because the uranyl ion is characterized by linear O—U—O bonding, there is typically an upper limit to the substitution that can be achieved, on the order of a few mole percent with respect to the site on which it is substituted. When substituting for a $M^{2+}$ ion there are size constraints between the $M^{2+}$ and the $(UO_2)_{2+}$ center that may create host lattice strain and/or compensating defects in the host lattice. As a result, concentration quenching of the $U^{6+}$ emission usually occurs before full substitution is achieved. In contrast, the phosphors of the present invention contain the $UO_2$ species as part of the host lattice and comprise uranyl ions at a concentration as high as about 40 mole % relative to the total number of moles of $M^{2+}$ cations present.

The uranium doped phosphors of the present invention may be produced by firing a mixture of precursors under an oxidizing atmosphere. Non-limiting examples of suitable precursors include the appropriate metal oxides, hydroxides, alkoxides, carbonates, nitrates, aluminates, silicates, citrates, oxalates, carboxylates, tartarates, stearates, nitrites, peroxides, phosphates, pyrophosphates and combinations thereof. Suitable materials for use as precursors include, but are not limited to, $BaCO_3$, $BaHPO_4$, $Ba_3(PO_4)_2$, $Ba_2P_2O_7$, $Ba_2Zn(PO_4)_2$, $BaZnP_2O_7$, $Ba(OH)_2$, $Ba(C_2O_4)$, $Ba(C_2H_3O_2)_2$, $Ba_3(C_6H_5O_7)_2$, $Ba(NO_3)_2$, $CaCO_3$, $Eu_2O_3$, $Mg(C_2O_4)$, $Mg(C_2H_3O_2)_2$, $Mg(C_6H_6O_7)$, $MgCO_3$, $MgO$, $Mg(OH)_2$, $Mg_3(PO_4)_2$, $Mg_2P_2O_7$, $Mg_2Ba(PO_4)_2$, $MgHPO_4$, $Mg(NO_3)_2$, $NH_4VO_3$, $(NH_4)_2HPO_4$, $NH_4MgPO_4$, Zn($C_2O_4$), Zn($C_2H_3O_2$)$_2$, Zn$_3$($C_6H_5O_7$)$_2$, ZnCO$_3$, ZnO, Zn(OH)$_2$, Zn$_3$(PO$_4$)$_2$, Zn$_2$P$_2$O$_7$, Zn$_2$Ba(PO$_4$)$_2$, ZnHPO$_4$, Zn(NO$_3$)$_2$, NH$_4$ZnPO$_4$, UO$_2$, UO$_2$(NO$_3$)$_2$, (UO$_2$)$_2$P$_2$O$_7$, (UO$_2$)$_3$(PO$_4$)$_2$, NH$_4$(UO$_2$)PO$_4$, UO$_2$CO$_3$, UO$_2$(C$_2$H$_3$O$_2$)$_2$, UO$_2$(C$_2$O$_4$), H(UO$_2$)PO$_4$, UO$_2$(OH)$_2$, and ZnUO$_2$(C$_2$H$_3$O$_2$)$_4$, and various hydrates. For example, the exemplary phosphor BaMgUO$_2$(PO$_4$)$_2$ may be produced by mixing the appropriate amounts of BaCO$_3$, MgO, and UO$_2$ with the appropriate amount of (NH$_4$)$_2$HPO$_4$ and then firing the mixture under an air atmosphere. In another example, the exemplary phosphor phase gamma Ba$_2$UO$_2$(PO$_4$)$_2$ may be produced by mixing the appropriate amounts of BaHPO$_4$ and UO$_2$ with an excess of (NH$_4$)$_2$HPO$_4$ (DAP) and then firing the mixture under an air atmosphere. The precursors may be in solid form or in solution. Non-limiting examples of solvents include water, ethanol, acetone, and isopropanol, and suitability depends chiefly on solubility of the precursors in the solvent. After firing, the phosphor may be milled to break up any agglomerates that may have formed during the firing procedure.

The mixture of starting materials for producing the phosphor may also include one or more low melting temperature flux materials, such as boric acid, borate compounds such as lithium tetraborate, alkali phosphates, and combinations thereof. Non-limiting examples include (NH$_4$)$_2$HPO$_4$ (DAP), Li$_3$PO$_4$, Na$_3$PO$_4$, NaBO$_3$—H$_2$O, Li$_2$B$_4$O$_7$, K$_4$P$_2$O$_7$, Na$_4$P$_2$O$_7$, H$_3$BO$_3$, and B$_2$O$_3$. The flux may lower the firing temperature and/or firing time for the phosphor. If a flux is used, it may be desirable to wash the final phosphor product with a suitable solvent to remove any residual soluble impurities that may have originated from the flux.

The firing of the samples is generally done in air but since the uranium is in its highest oxidation state (U$^{6+}$) in can also be fired in O$_2$ or other wet or dry oxidizing atmospheres, including at oxygen partial pressures above one atmosphere, at a temperature between about 900° C. and about 1300° C., particularly between about 1000° C. and about 1200° C., for a time sufficient to convert the mixture to the phosphor. The firing time required may range from about one to twenty hours, depending on the amount of the mixture being fired, the extent of contact between the solid and the gas of the atmosphere, and the degree of mixing while the mixture is fired or heated. The mixture may rapidly be brought to and held at the final temperature, or the mixture may be heated to the final temperature at a lower rate such as from about 2° C./minute to about 200° C./minute.

In another embodiment, the green-emitting phosphor may be quantum dot materials. Exemplary quantum dot materials are based on CdSe, ZnS or InP, including, but not limited to, core/shell luminescent nanocrystals such as CdSe/ZnS, InP/ZnS, PbSe/PbS, CdSe/CdS, CdTe/CdS or CdTe/ZnS. Other examples of the quantum dot materials include perovskite quantum dots such as CsPbX$_3$, where X is Cl, Br, I or a combination thereof.

In another embodiment, the green-emitting phosphor may be a sulfide phosphor. Examples of the sulfide phosphors include, but are not limited to: Suitable additional phosphors for use in the phosphor material include, but are not limited to: ZnS:Cu$^+$,Cl$^-$; ZnS:Cu$^+$,Al$^{3+}$; ZnS:Ag$^+$,Cl$^-$; ZnS:Ag$^+$,Al$^{3+}$; (Sr,Ca,Ba)(Al,Ga,In)$_2$S$_4$:Eu$^{2+}$; (Gd,Y,Lu,La)$_2$O$_2$S: Eu$^{3+}$,Bi$^{3+}$; (Ca,Sr,Mg)S:Eu$^{2+}$,Ce$^{3+}$; SrY$_2$S$_4$:Eu$^{2+}$; SrGa$_2$S$_4$: Eu$^{2+}$ and CaLa$_2$S$_4$:Ce$^{3+}$.

The red-emitting phosphor has formula I:

$$A_xMF_y:Mn^{4+} \quad \text{I}$$

wherein A is Li, Na, K, Rb, Cs, or a combination thereof;
M is Si, Ge, Sn, Ti, Zr, Al, Ga, In, Sc, Hf, Y, La, Nb, Ta, Bi, Gd, or a combination thereof; x is an absolute value of a charge of the MF$_y$ ion; and y is 5, 6 or 7. The phosphors of formula I and color stability are described in U.S. Pat. Nos. 7,497,973; 8,906,724; 8,252,613; and 9,698,314 and U.S. Publication No. US2016/0244663, the entire contents of each of which are incorporated herein by reference.

Examples of the red emitting phosphors of formula I include K$_2$[SiF$_6$]:Mn$^{4+}$, K$_2$[TiF$_6$]:Mn$^{4+}$, K$_2$[SnF$_6$]:Mn$^{4+}$, Cs$_2$[TiF$_6$]:Mn$^{4+}$, Rb$_2$[TiF$_6$]:Mn$^{4+}$, Cs$_2$[SiF$_6$]:Mn$^{4+}$, Rb$_2$[SiF$_6$]:Mn$^{4+}$, Na$_2$[SiF$_6$]:Mn$^{4+}$, Na$_2$[TiF$_6$]:Mn$^{4+}$, Na$_2$[ZrF$_6$]: Mn$^{4+}$, K$_3$[ZrF$_7$]:Mn$^{4+}$, K$_3$[BiF$_7$]:Mn$^{4+}$, K$_3$[YF$_7$]:Mn$^{4+}$, K$_3$[LaF$_7$]:Mn$^{4+}$, K$_3$[GdF$_7$]:Mn$^{4+}$, K$_3$[NbF$_7$]:Mn$^{4+}$ or K$_3$[TaF$_7$]:Mn$^{4+}$. In certain embodiments, the phosphor of formula I is K$_2$SiF$_6$:Mn$^{4+}$ or Na$_2$[SiF$_6$]:Mn$^{4+}$.

The phosphor material 14 may be present in any form such as powder, glass, composite e.g., phosphor-polymer composite or phosphor-glass composite. In some embodiments, the particle sizes of the phosphor material may be in a range from about 1 µm to about 50 µm. In another embodiment, the particle sizes may be small particle sizes of less than 10 µm. In one embodiment, the phosphor material has a D50 particle size of from about 1 µm to about 10 µm.

The phosphor material 14 may be used as a film, layer, sheet, strip, dispersed particulates, or a combination thereof. In some embodiments, the phosphor material is dispersed in a film. In other embodiments, the phosphor material may be dispersed in an ink composition. In some embodiments, the phosphor material 14 includes the green-emitting U$^{6+}$-doped phosphor in glass form. In some of these embodiments, the device 10 may include the phosphor material 14 in form of a phosphor wheel (not shown in figures). The phosphor wheel may include the phosphor material in glass form. A phosphor wheel and related devices are described in U.S. Pat. No. 10,615,316.

In another embodiment, the phosphor material may further include one or more other luminescent materials. Additional luminescent materials such as blue, yellow, red, orange, or other color phosphors may be used in the phosphor material to customize the white color of the resulting light and produce specific spectral power distributions.

Suitable additional phosphors for use in the phosphor material include, but are not limited to: ((Sr$_{1-z}$(Ca, Ba, Mg, Zn)$_z$)$_{1-(x+w)}$(Li, Na, K, Rb)$_w$Ce$_x$)$_3$(Al$_{1-y}$Si$_y$)O$_{4+y+3(x-w)}$ F$_{1-y-3(x-w)}$, 0<x≤0.10, 0≤y≤0.5, 0≤z≤0.5, 0≤w≤x; (Ca, Ce)$_3$Sc$_2$Si$_3$O$_{12}$ (CaSiG); (Sr,Ca,Ba)$_3$Al$_{1-x}$Si$_x$O$_{4+x}$F$_{1-x}$:Ce$^{3+}$ (SASOF)); (Ba,Sr,Ca)$_5$(PO$_4$)$_3$(Cl,F,Br,OH):Eu$^{2+}$,Mn$^{2+}$; (Ba,Sr,Ca)BPO$_5$:Eu$^{2+}$,Mn$^{2+}$; (Sr,Ca)$_{10}$(PO$_4$)$_6$*vB$_2$O$_3$:Eu$^{2+}$ (wherein 0<v≤1); Sr$_2$Si$_3$O$_8$*2SrCl$_2$:Eu$^{2+}$; (Ca,Sr,Ba)$_3$MgSi$_2$O$_8$:Eu$^{2+}$,Mn$^{2+}$; BaAl$_8$O$_{13}$:Eu$^{2+}$; 2SrO*0.84P$_2$O$_5$*0.16B$_2$O$_3$:Eu$^{2+}$; (Ba,Sr,Ca)MgAl$_{10}$O$_{17}$: Eu$^{2+}$,Mn$^{2+}$; (Ba,Sr,Ca)Al$_2$O$_4$:Eu$^{2+}$; (Y,Gd,Lu,Sc,La)BO$_3$: Ce$^{3+}$,Tb$^{3+}$; (Ba,Sr,Ca)$_2$Si$_{1-n}$O$_{4-2n}$:Eu$^{2+}$ (wherein 0≤n≤0.2); (Ba,Sr,Ca)$_2$(Mg,Zn)Si$_2$O$_7$:Eu$^{2+}$; (Y,Gd,Tb,La,Sm,Pr,Lu)$_3$ (Al,Ga)$_{5-a}$O$_{12-3/2a}$:Ce$^{3+}$ (wherein 0≤a≤0.5); (Ca,Sr)$_8$(Mg, Zn)(SiO$_4$)$_4$Cl$_2$:Eu$^{2+}$,Mn$^{2+}$; Na$_2$Gd$_2$B$_2$O$_7$:Ce$^{3+}$,Tb$^{3+}$; (Sr,Ca, Ba,Mg,Zn)$_2$P$_2$O$_7$:Eu$^{2+}$,Mn$^{2+}$; (Gd,Y,Lu,La)$_2$O$_3$:Eu$^{3+}$,Bi$^{3+}$; (Gd,Y,Lu,La)VO$_4$:Eu$^{3+}$,Bi$^{3+}$; (Ba,Sr,Ca)MgP$_2$O$_7$:Eu$^{2+}$, Mn$^{2+}$; (Y,Lu)$_2$WO$_6$:Eu$^{3+}$,Mo$^{6+}$; (Ba,Sr,Ca)$_b$Si$_g$N$_m$:Eu$^{2+}$ (wherein 2b+4g=3m); Ca$_3$(SiO$_4$)Cl$_2$:Eu$^{2+}$; (Lu,Sc, Y,Tb)$_{2-u-v}$Ce$_v$Ca$_{1+u}$Li$_w$Mg$_{2-w}$P$_w$(Si,Ge)$_{3-w}$O$_{12-u/2}$ (where −0.5≤u≤1, 0<v≤0.1, and 0≤w≤0.2); (Y,Lu,Gd)$_{2-m}$(Y,Lu,Gd) Ca$_m$Si$_4$N$_{6+m}$C$_{1-m}$:Ce$^{3+}$, (wherein 0≤m≤0.5); (Lu,Ca,Li,Mg, Y), alpha-SiAlON doped with Eu$^{2+}$ and/or Ce$^{3+}$; Sr(LiAl$_3$N$_4$):Eu$^{2+}$, (Ca,Sr,Ba)SiO$_2$N$_2$:Eu$^{2+}$,Ce$^{3+}$; beta-SiAlON:Eu$^{2+}$, 3.5MgO*0.5MgF$_2$*GeO$_2$:Mn$^{4+}$; Ca$_{1-c-f}$ Ce$_c$Eu$_f$Al$_{1+c}$Si$_{1-c}$N$_3$, (where 0≤c≤0.2, 0≤f≤0.2); Ca$_{1-h-r}$ $Ce_hEu_rAl_{1-h}(Mg,Zn)_hSiN_3$, (where 0≤h≤0.2, 0≤r≤0.2); $Ca_{1-2s-t}Ce_s(Li,Na)_sEu_rAlSiN_3$, (where 0≤s≤0.2, 0≤t≤ 0.2, s+t>0); (Sr, Ca)AlSiN$_3$:Eu$^{2+}$,Ce$^{3+}$, and Li$_2$CaSiO$_4$:Eu$^{2+}$.

The ratio of each of the individual phosphors in the phosphor material may vary depending on the characteristics of the desired light output. The relative proportions of the individual phosphors in the various phosphor materials may be adjusted such that when their emissions are blended and employed in a device, for example a lighting apparatus, there is produced visible light of predetermined x and y values on the CIE chromaticity diagram.

Other additional luminescent materials suitable for use in the phosphor material may include electroluminescent polymers such as polyfluorenes, preferably poly(9,9-dioctyl fluorene) and copolymers thereof, such as poly(9,9'-dioctylfluorene-co-bis-N,N'-(4-butylphenyl)diphenylamine) (F8-TFB); poly(vinylcarbazole) and polyphenylenevinylene and their derivatives. In addition, the light emitting layer may include a blue, yellow, orange, green or red phosphorescent dye or metal complex, or a combination thereof. Materials suitable for use as the phosphorescent dye include, but are not limited to, tris(1-phenylisoquinoline) iridium (III) (red dye), tris(2-phenylpyridine) iridium (green dye) and Iridium (III) bis(2-(4,6-difluorephenyl)pyridinato-N, C2) (blue dye). Commercially available fluorescent and phosphorescent metal complexes from ADS (American Dyes Source, Inc.) may also be used. ADS green dyes include ADS060GE, ADS061GE, ADS063GE, and ADS066GE, ADS078GE, and ADS090GE. ADS blue dyes include ADS064BE, ADS065BE, and ADS070BE. ADS red dyes include ADS067RE, ADS068RE, ADS069RE, ADS075RE, ADS076RE, ADS067RE, and ADS077RE.

In another aspect, the present disclosure relates to a device used in conjunction with night vision equipment, where the device includes an LED light source optically coupled and/or radiationally connected to a phosphor material including a red-emitting phosphor having the formula Na$_2$SiF$_6$:Mn$^{4+}$. The device limits emission of wavelengths longer than 650 nm to no more than 1.0% of total emission.

Figure 3:
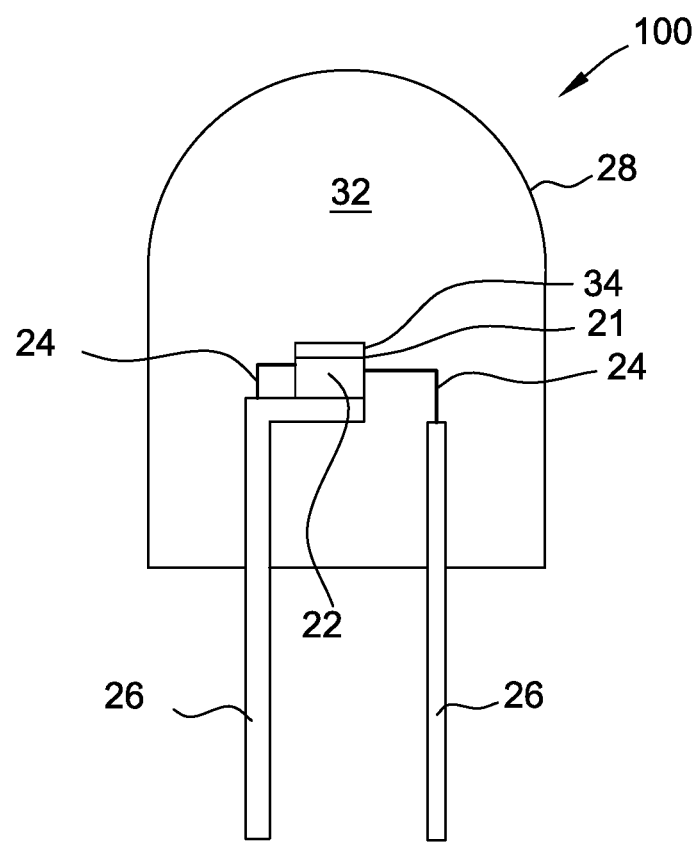
FIG. 3 is a schematic cross-sectional view of a lighting apparatus, in accordance with one embodiment of the disclosure.

In one embodiment, a lighting apparatus comprises the device. FIG. 3 illustrates a lighting apparatus or lamp 100, in accordance with some embodiments. The lighting apparatus 100 includes an LED chip 22, and leads 24 electrically attached to the LED chip 22. The leads 24 may comprise thin wires supported by a thicker lead frame(s) 26 or the leads 24 may comprise self-supported electrodes and the lead frame may be omitted. The leads 24 provide current to LED chip 22 and thus cause it to emit radiation.

The LED chip 22 may be encapsulated within an envelope 28. The envelope 28 may be formed of, for example, glass or plastic. The LED chip 22 may be enclosed by an encapsulant material 32. The encapsulant material 32 may be a low temperature glass, or a polymer or resin known in the art, for example, an epoxy, silicone, epoxy-silicone, acrylate or a combination thereof. In an alternative embodiment, the lighting apparatus 100 may only include the encapsulant material 32 without the envelope 28. Both the envelope 28 and the encapsulant material 32 should be transparent to allow light to be transmitted through those elements.

With continued reference to FIG. 3, a layer 34 of the phosphor material, as previously described, is disposed on a surface 21 of the LED chip 22. The layer 34 may be disposed by any appropriate method, for example using a slurry prepared by mixing silicone and the phosphor material. In one such method, a silicone slurry in which the particles of the phosphor material are randomly suspended, is placed around the LED chip 22. This method is merely exemplary of possible positions of the layer 34 and LED chip 22. As illustrated, the layer 34 may be disposed for example, coated over or directly on the surface 21 of the LED chip 22 by coating or printing, such as ink jet printing, and drying the slurry over the LED chip 22. In another embodiment, the phosphor material may be dispersed in a film disposed on the surface 21 of the LED chip 22 or disposed in a remote location from the LED chip 22. The surface 21 is a light emitting surface of the LED chip 22. The light emitted by the LED chip 22 mixes with the light emitted by the phosphor material of the layer 34 to produce desired emission.

Figure 4:
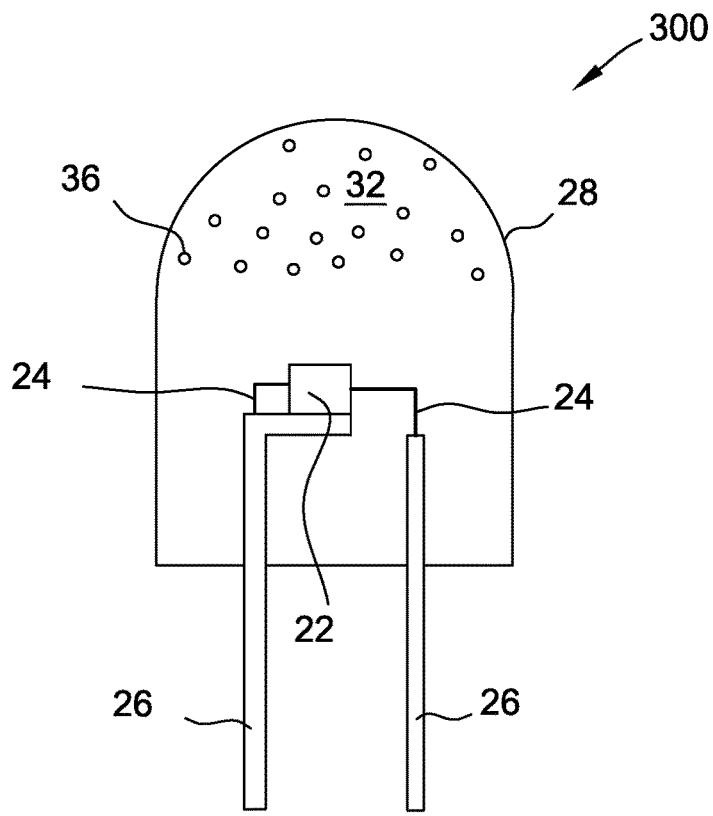
FIG. 4 is a schematic cross-sectional view of a lighting apparatus, in accordance with an embodiment of the disclosure.

In some other embodiments, the phosphor material is interspersed within the encapsulant material 32, instead of being disposed directly on the LED chip 22 as shown in FIG. 3. FIG. 4 illustrates a lighting apparatus 300 that includes particulates 36 of the phosphor material interspersed within a portion of the encapsulant material 32. The particulates of the phosphor material may be interspersed throughout the entire volume of the encapsulant material 32. Blue or UV light emitted by the LED chip 22 mixes with the light emitted by the particulates 36 of the phosphor material, and the mixed light transmits out from the lighting apparatus 300.

Figure 5:
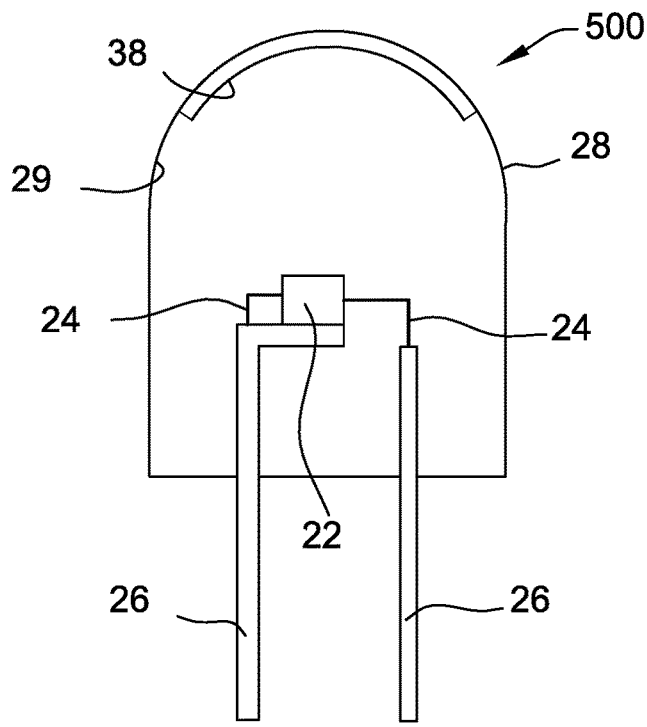
FIG. 5 is a schematic cross-sectional view of a lighting apparatus, in accordance with an embodiment of the disclosure.

In some other embodiments, a layer 38 of the phosphor material is coated onto a surface of the envelope 28 as illustrated in FIG. 5, instead of being formed over the LED chip 22 (FIG. 3). As shown, the layer 38 is coated on an inside surface 29 of the envelope 28, although the layer 38 may be coated on an outside surface of the envelope 28, if desired. The layer 38 may be coated on the entire surface of the envelope 28 or only a top portion of the inside surface 29 of the envelope 28. The UV/blue light emitted by the LED chip 22 mixes with the light emitted by the layer 38, and the mixed light transmits out. Of course, the phosphor material may be located in any two or all three locations (as shown in FIGS. 3-5) or in any other suitable location, such as separately from the envelope 28 or integrated into the LED chip 22.

In any or all the above configurations, the lighting apparatus 100, 300, or 500 shown respectively in FIG. 3, FIG. 4 or FIG. 5 may also include a plurality of scattering particles (not shown), which are embedded in the encapsulant material 32. The scattering particles may comprise, for example, alumina, silica, zirconia, or titania. The scattering particles effectively scatter the directional light emitted from the LED chip 22, preferably with a negligible amount of absorption.

Figure 6:
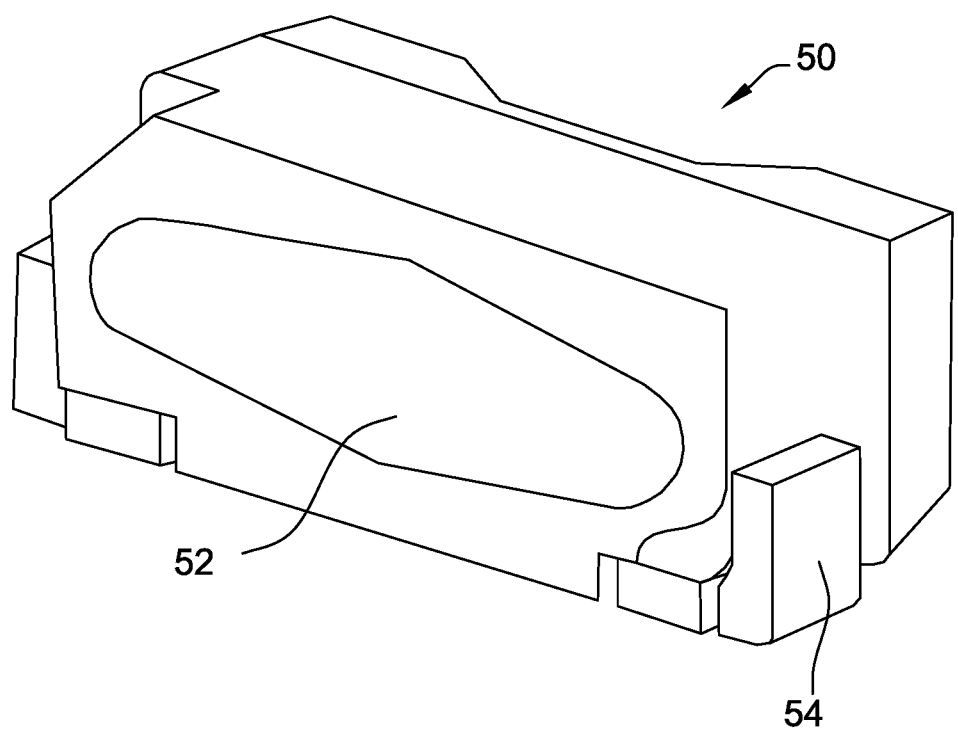
FIG. 6 is a schematic perspective view of a surface-mounted device (SMMD), in accordance with one embodiment of the disclosure.

In one embodiment, the lighting apparatus 100, 300 or 500 shown in FIG. 3, FIG. 4 or FIG. 5 may be a backlight apparatus. In another embodiment, the backlight apparatus comprises a backlight unit 10. Some embodiments are directed to a backlight apparatus 50 as illustrated in FIG. 6. The backlight apparatus 50 includes a surface mounted device (SMD) type light emitting diode for backlight or display applications. This SMD is a "side-emitting type" and has a light-emitting window 52 on a protruding portion of a light guiding member 54. An SMD package may comprise an LED chip and a phosphor material. In one embodiment, the backlight apparatus may be an edge lit apparatus or side-emitting apparatus. In another embodiment, the backlight apparatus may be a direct lit apparatus. A backlight apparatus and related devices are described in U.S. Publication No. 2017/0254943.

Devices of the present disclosure may be used as lighting and backlight apparatuses for general illumination and displays or display applications. Examples include chromatic lamps, plasma screens, xenon excitation lamps, UV excitation marking systems, automotive headlamps, home and theatre projectors, laser pumped devices, point sensors, liquid crystal display (LCD) backlight units, instrument displays, display panels, night vision compatible displays, panels, televisions, computer monitors, laptops, mobile or cell phones, smartphones, tablet computers, notebook computers, vehicular displays, automotive displays and other handheld devices that have a display including an LED source as described herein. The list of these applications is meant to be merely exemplary and not exhaustive. In one embodiment, the display is a night vision display or night vision compatible display. The night vision display is a display device configured to emit light to visually represent information to an operator without causing a decrease in visibility through night vision equipment or night vision gear, such as night vision goggles. In one embodiment, a lighting system, such as a night vision lighting system, includes a night vision display.

Figure 7:
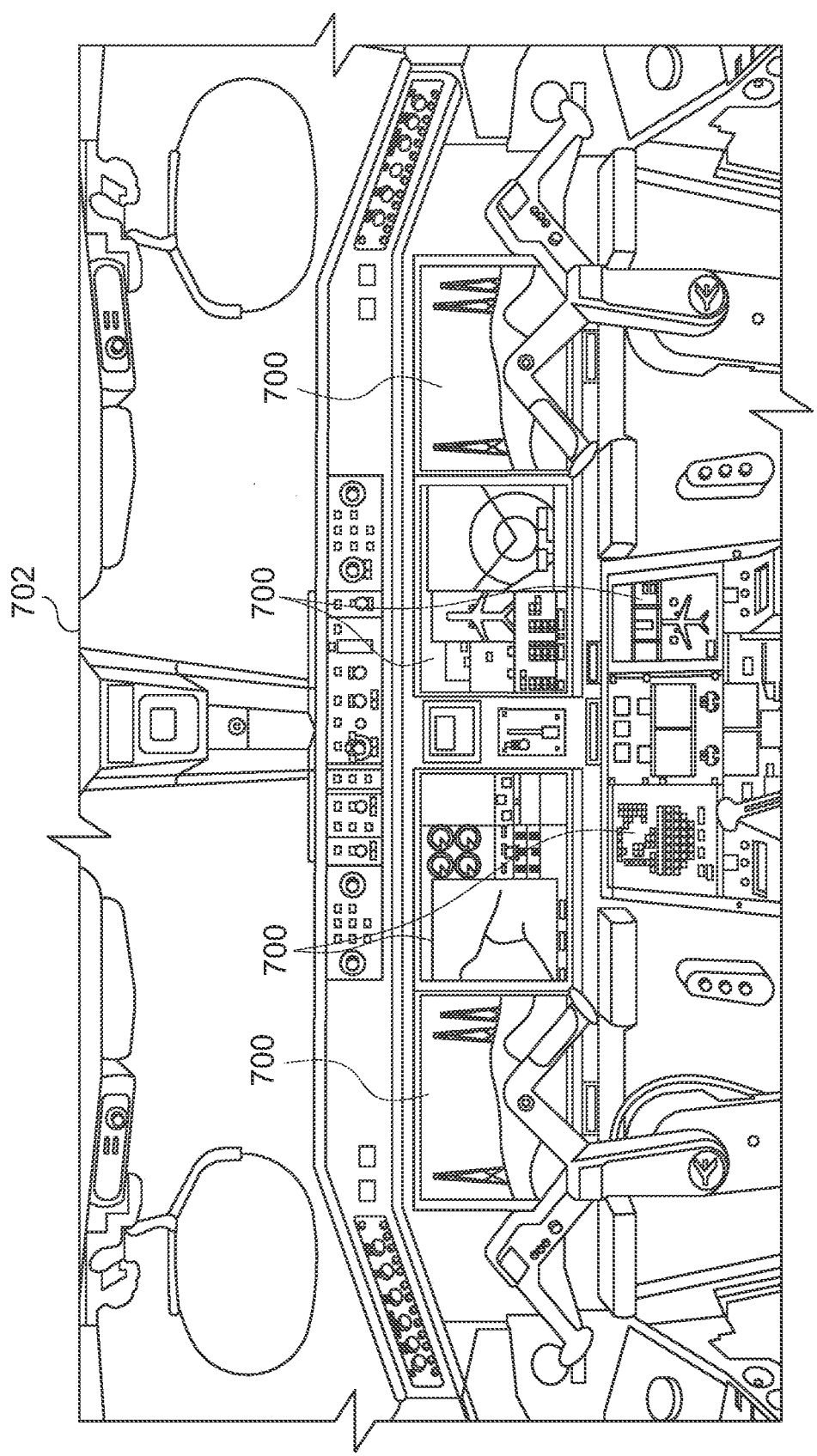
FIG. 7 illustrates a display that may be used onboard one or more vehicles, in accordance with an embodiment of the disclosure.

FIG. 7 illustrates one example of a display or instrument display 700 that may be used onboard one or more vehicles 702. The display applications 700 can represent LCD displays, LED displays, or other types of monitors that generate light to represent information that is visually conveyed to one or more operators of the vehicle 702. These instrument displays 700 can be disposed in a cockpit or vehicle display to provide visual indicators representative of operating characteristics of the vehicle 702, geographic information, travel information, armament details, and similar information based on the system and applications. The vehicle 702 in this example is an aircraft, however similar displays are used on other types of vehicles 702, such as helicopters, automobiles, tanks, ships, and trains.

In one embodiment, the display may be a single channel or single mode NVIS compatible display that is bright enough for daytime operations and compatible with night vision equipment used in dimly lit environments, such as nighttime, smoke, fog, adverse weather, and similar conditions, without interfering with the functionality of the night vision equipment.

In another embodiment, a single mode or single channel display including the device or backlight unit can be used without dyes or additional filters, such as NVIS filters, IR filters or filter glass, to block near-IR light. A single mode NVIS compatible display without additional filters has improved brightness and color quality, is thinner, weighs less and is more cost effective. A single mode display also has a simpler architecture and is easier to operate, as the operator does not need to switch between different modes.

Figure 8A:
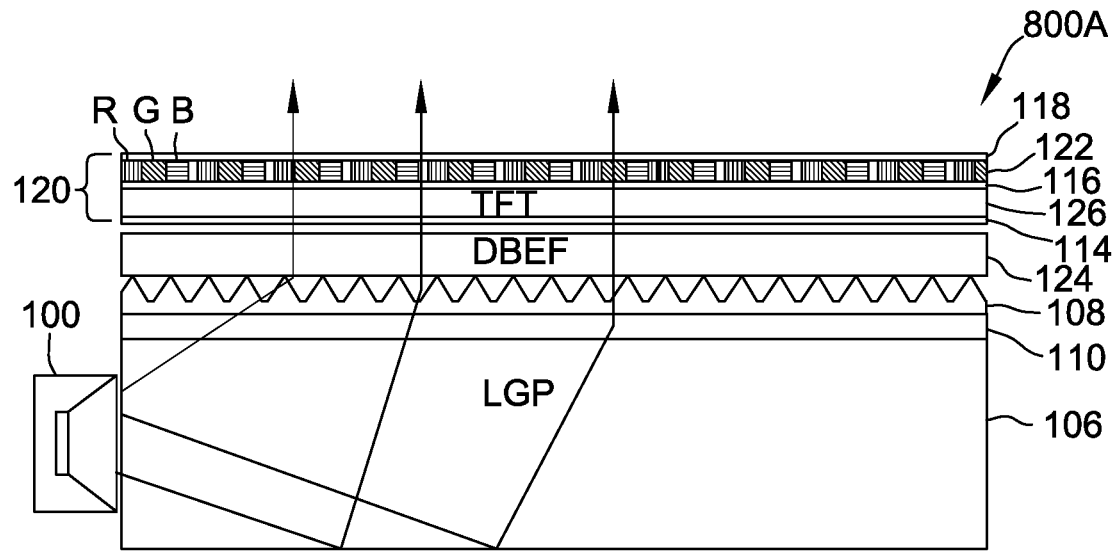
FIG. 8A is a schematic diagram of a single mode liquid crystal display (LCD) with an edge lit backlight configuration, in accordance with an embodiment of the disclosure.

FIG. 8A illustrates an embodiment of a single mode liquid crystal display (LCD) with an edge lit backlight configuration. LCD 800A includes a light apparatus or backlight apparatus 100, as described previously in FIG. 3, light guide panel 106 and an LCD panel 120. The LCD 800A uses the LCD panel 120 with control electronics and the backlight apparatus 100 to produce color images. The backlight apparatus 100 provides white light and represents a plurality of backlight apparatuses 100.

The LCD panel 120 includes color filters 122 arranged in subpixels, such as a red color filter, a green color filter and a blue color filter. The red, green and blue filters 122 transmit a light having a specific wavelength of white light incident from the backlight apparatus 100. The filters 122 transmit wavelengths of light corresponding to the color of each filter, and absorb other wavelengths.

The LCD panel 120 may include a front polarizer 118, a rear polarizer 114, a thin film transistor 126 and liquid crystal 116, as well as electrodes (not shown). The color filters 122 may be positioned between the liquid crystal 116 and the front polarizer 118. The thin film transistor 126 may be positioned between the liquid crystal and the rear polarizer 114. Each pixel has a corresponding transistor or switch for controlling voltage applied to the liquid crystal 116. The front and rear polarizers 118 and 114 may be set at right angles. In one aspect, the LCD panel 120 is opaque. When a voltage is applied across the liquid crystal 116, rod-shaped polymers align with the electric field and untwist such that the voltage controls the light output from the front polarizer 118. For example, when a voltage is applied to the liquid crystal 116, the liquid crystal 116 rotates so that there is a light output from the front polarizer 118.

White light from the backlight apparatus 100 travels toward light guide panel 106, through diffuser film 110 and prism 108, as well as double brightness enhanced film 124, which provides a uniform light backlight for the LCD panel 120.

Figure 8B:
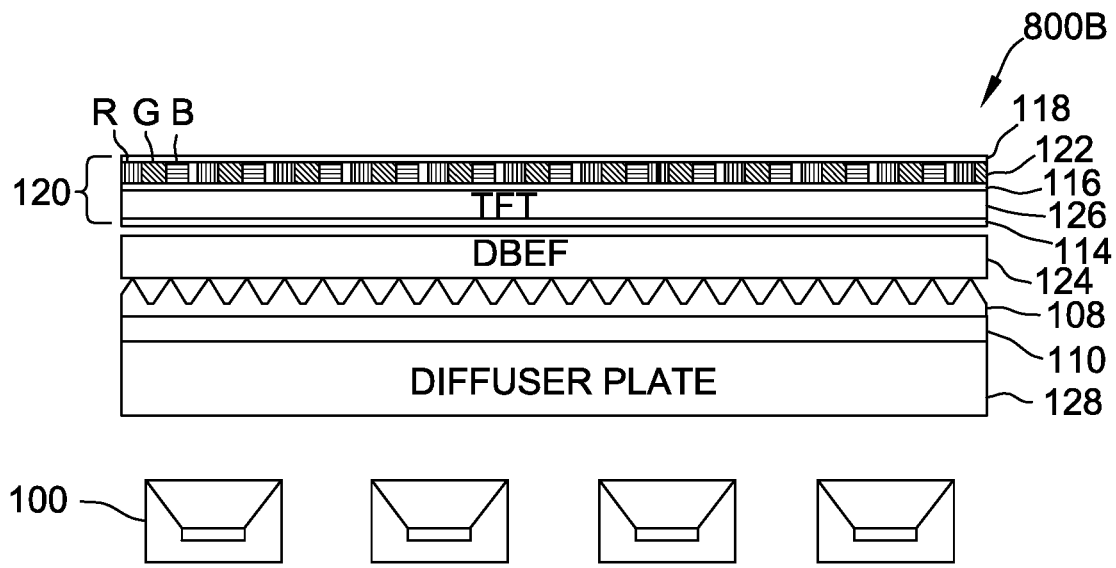
FIG. 8B is a schematic diagram of a single mode LCD with a direct lit backlight configuration, in accordance with an embodiment of the disclosure.

FIG. 8B illustrates an embodiment of a single mode LCD with a direct lit backlight configuration. The direct lit backlight configuration is similar to the edge lit backlight configuration shown in FIG. 8A, except that there is no light guide panel 106 and there is a different arrangement of backlight apparatus 100. A plurality of backlight apparatuses 100 are arranged to directly provide light to a diffuser plate 128, which may support a diffuser film 110.

In one embodiment, a single channel or single mode display may include light-weight filters and thinner filters to further limit the emission of wavelengths longer than 650 nm or wavelengths at 665 nm and longer. A single mode display with reduced filtering is compatible with day lighting and night lighting, while maintaining high brightness levels and good color quality or color gamut.

Figure 9A:
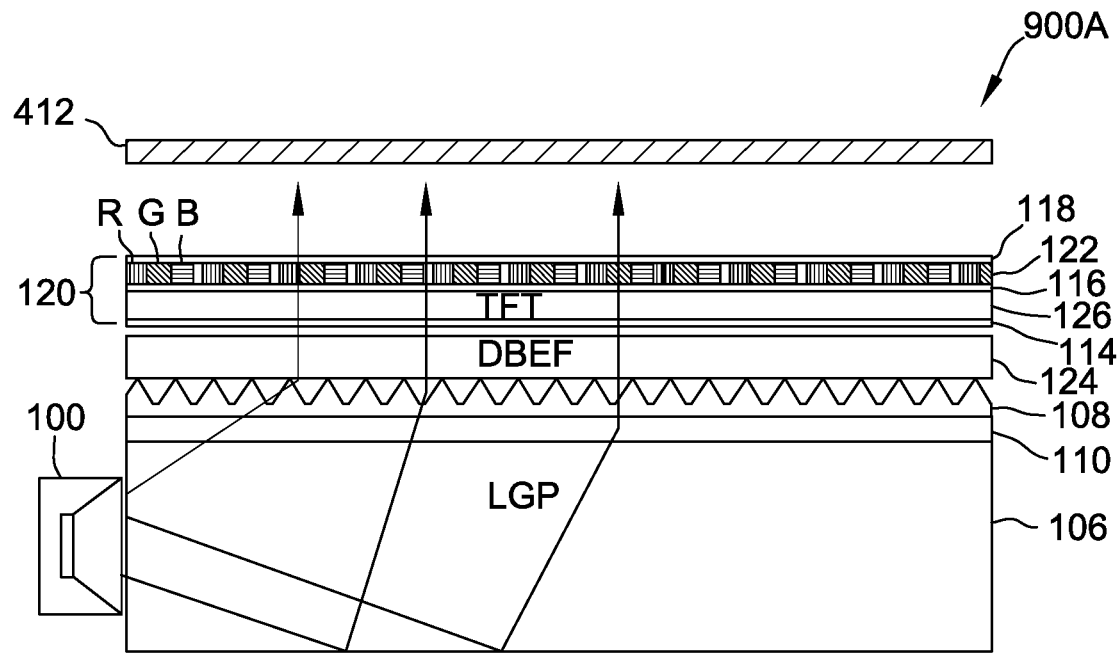
FIG. 9A is a schematic diagram of a single mode LCD with an edge lit backlight configuration, in accordance with an embodiment of the disclosure.

FIG. 9A illustrates an embodiment of a single mode LCD with an edge lit backlight configuration 900A. The single mode LCD 900A is similar to the single mode LCD 800A shown in FIG. 8A, except that it includes an NVIS filter 412 to block transmission of near-IR light. In one embodiment, NVIS filters or IR filters may be dichroic reflective filters or absorbing filters, such as infrared absorbers, light stabilizers, dyes or pigments in a glass or plastic matrix. In one embodiment, the NVIS filter has an optical density of 1.0 or less (transmittance of 10% or less). The term "optical density" provides a measurement of the amount of light, including near-IR wavelengths that the filter blocks or prevents from being transmitted. Thinner filters have reduced optical density values and higher transmittance levels. In another embodiment, the NVIS filter has an optical density of 0.5 or less (transmittance of 32% or less).

Figure 9B:
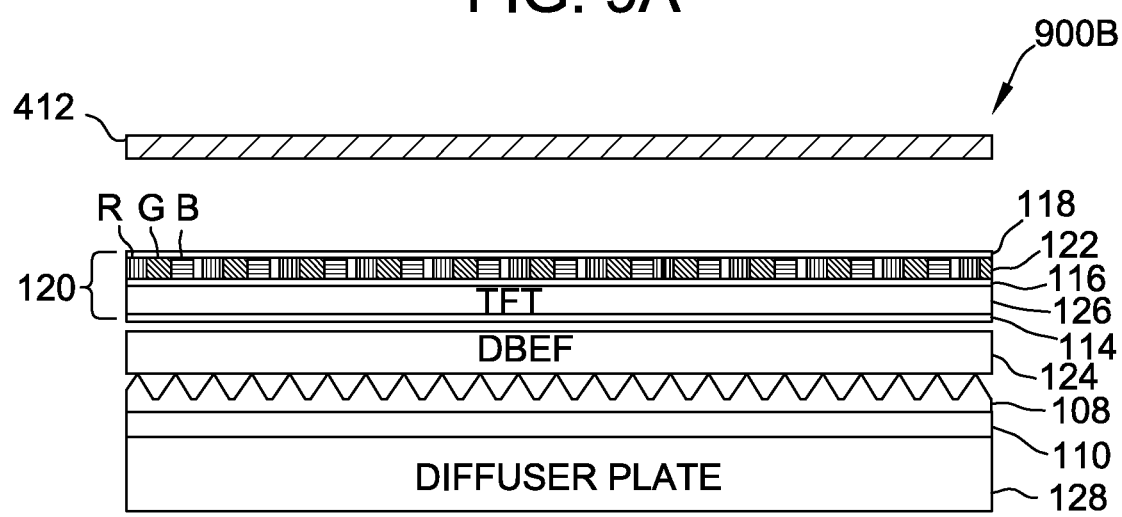
FIG. 9B is a schematic diagram of a single mode LCD with a direct lit backlight configuration, in accordance with an embodiment of the disclosure.
Figure 9B:
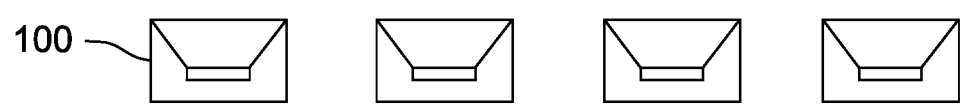

FIG. 9B illustrates an embodiment of a single mode LCD with a direct lit backlight configuration 900B. The single mode LCD 900B is similar to the single mode LCD 800B shown in FIG. 8B, except that it includes an NVIS filter 412 to block transmission of near-IR light. In one embodiment, the NVIS filter 412 shown in FIG. 9A and FIG. 9B may be removable or movable. In one aspect, the NVIS filter 412 may be removed manually by an operator for example, during day lighting as desired and applied manually by an operator during night lighting or when using night vision equipment. In another aspect, the NVIS filter 412 may be automated to be removed or applied as desired by the operator, such as for example, applying the NVIS filter 412 when using night vision equipment or removing the NVIS filter 412 during daylight or day lighting. In another embodiment, the NVIS filter may be automated to be removed or applied in response to the lighting of the environment. For example, the NVIS filter 412 may be removed during day lighting and applied during night lighting or low-light conditions. In one embodiment, a single channel display including an NVIS filter provides a high brightness level. Brightness level may be defined in terms of nits. In one embodiment, the display has a brightness level of less than a 25% reduction in brightness (nits) as compared with a single channel display with no added NVIS filters. In another embodiment, the display has less than a 20% reduction in brightness. In another embodiment, the display has less than a 15% reduction in brightness. In another embodiment, the display has no more than a 10% reduction in brightness.

In another embodiment, a single channel or mode display including an NVIS filter provides less than a 10% red color point shift from a single mode display without an NVIS filter. In another embodiment, the display has less than a 5% red color point shift from a single mode display without an NVIS filter.

Figure 10A:
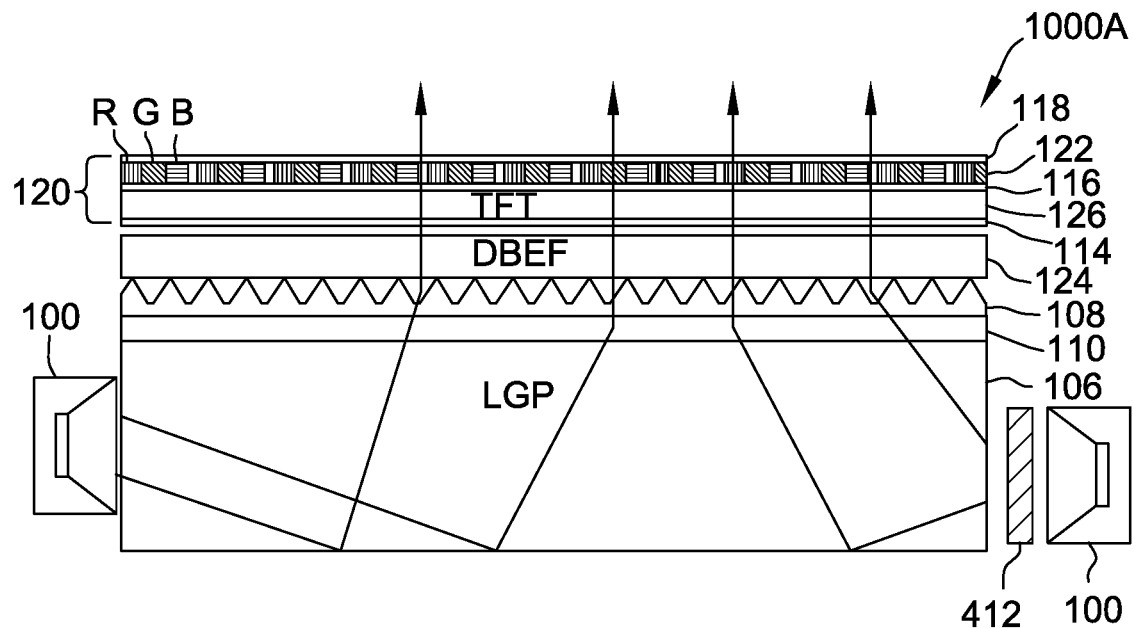
FIG. 10A is a schematic diagram of a display, in accordance with an embodiment of the disclosure.
Figure 10B:
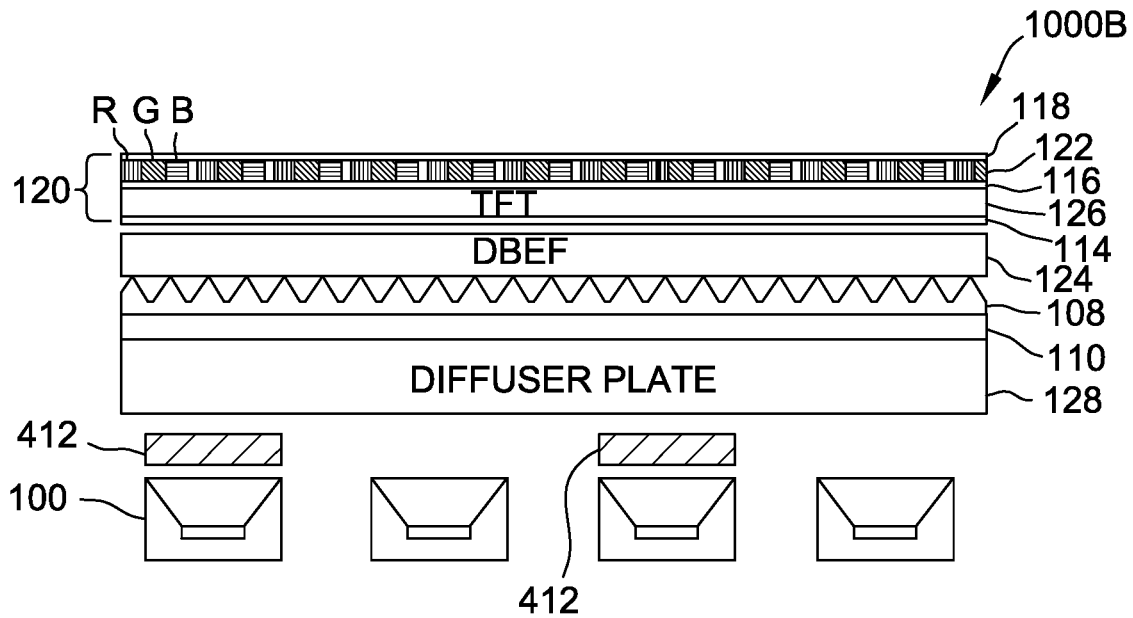
FIG. 10B is a schematic diagram of a display, in accordance with an embodiment of the disclosure.

In one embodiment, a display is a dual mode display including a day mode and a night mode. The day mode is compatible with bright lighting, such as daytime light and the night mode is compatible with low-light levels and night vision equipment. An operator switches between the day mode and night mode as needed to adjust to lighting levels in the environment and night vision equipment use. FIG. 10A and FIG. 10B are schematic diagrams of a dual mode display 1000A and 1000B, respectively. FIG. 10A illustrates an embodiment of a dual mode display with an edge lit backlight configuration 1000A and is similar to the LCD 800A shown in FIG. 8A, except that it includes an NVIS filter 412 to block transmission of near-IR light in a night mode or night vision compatible channel. The day mode does not have an NVIS filter and is compatible with bright daytime light. In night mode, a backlight apparatus 100 is associated with an NVIS filter 412. In the embodiment shown in FIG. 10A, the backlight apparatus 100 on one side of the display (left side) does not have an associated NVIS filter. In this embodiment, during day lighting, the backlight apparatus on the left side would be activated to provide lighting compatible with day lighting. During night lighting or when using night vision equipment, the backlight apparatus 100 on the right side of the display associated with an NVIS filter 412 would be activated to block near-IR wavelengths.

In FIG. 10B, an embodiment of a dual mode display with direct lit backlight configuration 1000B is provided. The LCD 1000B is similar to the LCD 800B shown in FIG. 8B, except that it includes an NVIS filter 412 to block transmission of near-IR light in a night mode or night vision compatible channel. As provided in FIG. 10A, during day lighting, backlight apparatuses that are not associated with an NVIS filter 412 are activated to provide lighting compatible with day lighting. During night lighting or when using night vision equipment, the backlight apparatuses 100 associated with an NVIS filter 412 would be activated to block near-IR wavelengths. In one aspect, the NVIS filter may be applied to the backlight apparatus as shown in FIG. 10A and FIG. 10B. In another aspect, the NVIS filter 412 may be applied to the LCD panel 120 as shown in FIG. 9A and FIG. 9B.

In one embodiment, a display has less than a 10% red color point shift between a day mode or bright light environment and a night mode or low-light environment. In another embodiment, a display has less than a 5% red color point shift between a day mode or bright light environment and a night mode or low-light environment.

In one embodiment, the display provides a brightness level of no more than 25% difference between a day mode and a night mode. In another embodiment, the display provides a brightness level of no more than 20% difference between a day mode and a night mode. In another embodiment, the display provides a brightness level of no more than 15% difference between a day mode and a night mode. In another embodiment, the display provides a brightness level of no more than 10% difference between a day mode and a night mode.

In one embodiment, the optical density between the filters in the night mode and the filters in the day mode are less than 1.0. In another embodiment, the optical density between the filters in the night mode and day mode is less than 0.5.

In one embodiment, a display provides less than 20% difference in color gamut between the day mode and the night mode. In another embodiment, a display has less than 10% difference in color gamut between the day mode and the night mode. In another embodiment, the display provides less than a 5% difference in color gamut between the day mode and the night mode in at least one of the color spaces measured according to NTSC, DCI-P3, Adobe or BT2020 standards. In another embodiment, a display provides less than a 10% color shift in a red spectrum of the white light between the day mode and the night mode.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

EXAMPLES

Example 1

Figure 11:
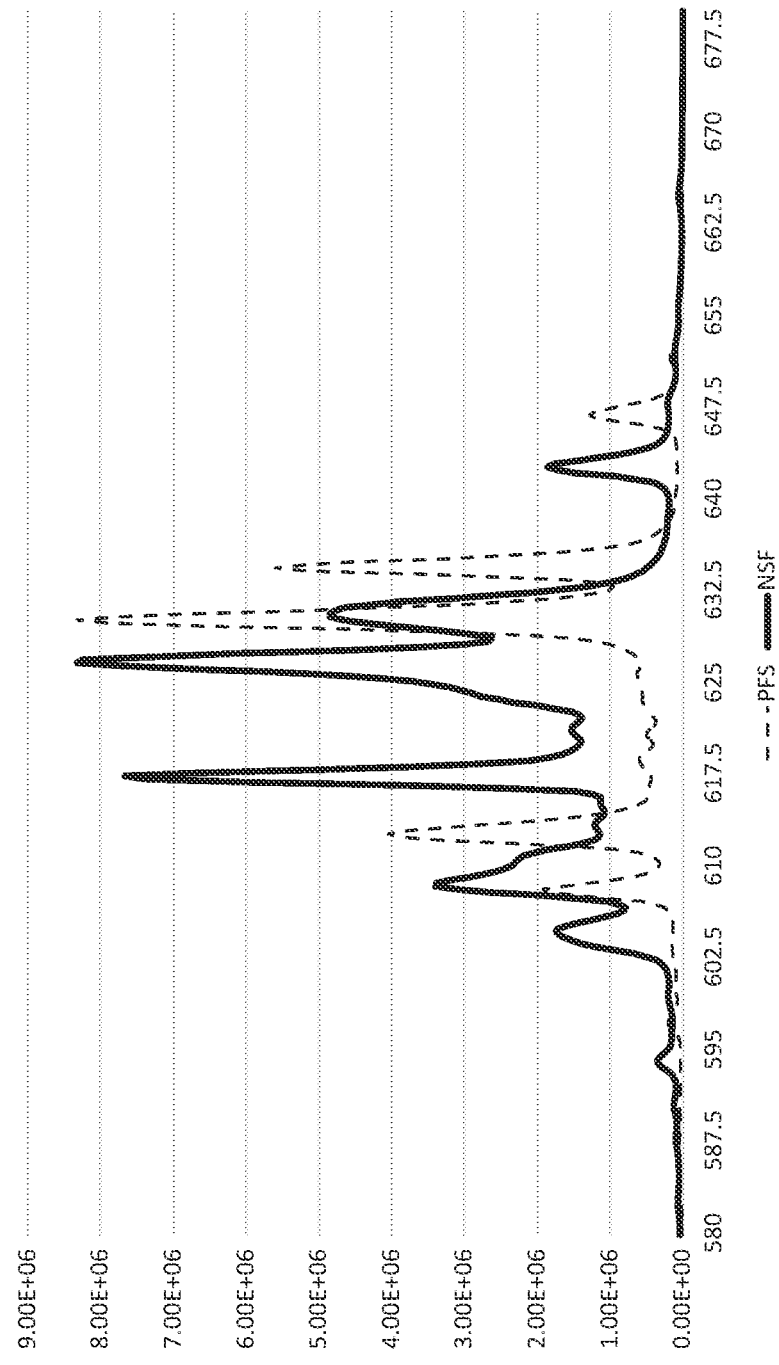
FIG. 11 shows an emission spectrum in the wavelength range of 580 to 677.5 for red-emitting phosphors $K_2SiF_6:Mn^{4+}$ (PFS) and $Na_2SiF_6:Mn^{4+}$ (NFS).

FIG. 11 shows an emission spectrum of red phosphors, $K_2SiF_6:Mn^{4+}$ (PFS) and $Na_2SiF_6:Mn^{4+}$ (NFS). The red phosphor $K_2SiF_6:Mn^{4+}$ has a 1.75% emission at wavelengths longer than 650, based on total emission and the red phosphor $Na_2SiF_6:Mn^{4+}$ has a 1.02% emission at wavelengths longer than 650, based on total emission. The $Na_2SiF_6:Mn^{4+}$ demonstrates a 30% faster photoluminescence (PL) decay time.

Example 2

Figure 12:
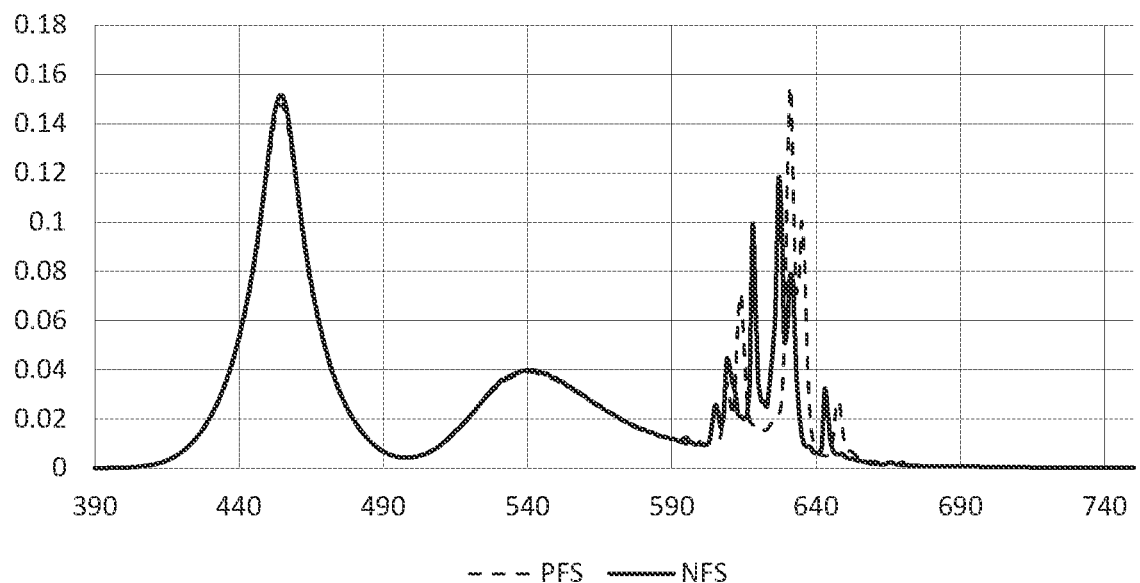
FIG. 12 shows an emission spectrum in the wavelength range of 390 to 740 of $\beta$-SiAlON:$Eu^2$ with $K_2SiF_6:Mn^{4+}$ (PFS) and $\beta$-SiAlON:$Eu^2$ with $Na_2SiF_6:Mn^{4+}$ (NFS).

FIG. 12 shows an emission spectrum of a phosphor material including a green-emitting phosphor, $\beta$-SiAlON:$Eu^2$, and a red phosphor, $K_2SiF_6:Mn^{4+}$ or $Na_2SiF_6:Mn^{4+}$. The combination of $\beta$-SiAlON:$Eu^2$ with $K_2SiF_6:Mn^{4+}$ (PFS) has a 1.28% emission at wavelengths longer than 650 and a 0.61% emission at wavelengths ≥665 nm, based on total emission and the combination of $\beta$-SiAlON:$Eu^2$ with $Na_2SiF_6:Mn^{4+}$ (NFS) has a 1.00% at wavelengths longer than 650 and a 0.56% emission at ≥665 nm, based on total emission.

Example 3

Figure 13:
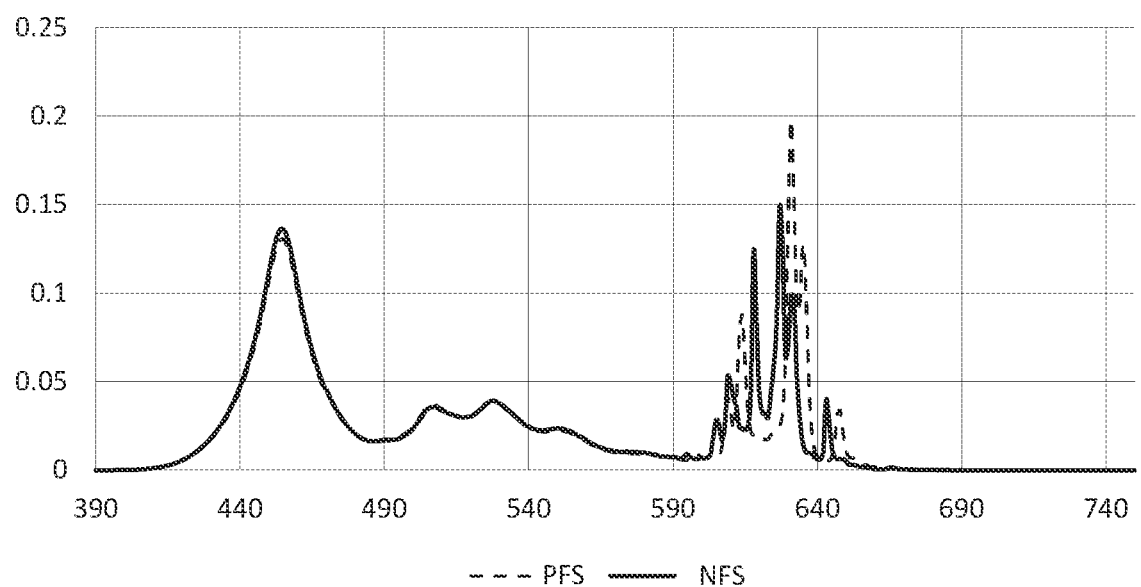
FIG. 13 shows an emission spectrum in the wavelength range of 390 to 740 for $RbMgPO_4:U^{6+}$ with $K_2SiF_6:Mn^{4+}$ (PFS) and $RbMgPO_4:U^{6+}$ with $Na_2SiF_6:Mn^{4+}$ (NFS).

FIG. 13 shows an emission spectrum of a phosphor material including a green-emitting phosphor, $RbMgPO_4:U^{6+}$, and a red phosphor, $K_2SiF_6:Mn^{4+}$ or $Na_2SiF_6:Mn^{4+}$. The combination of $RbMgPO_4:U^{6+}$ with $K_2SiF_6:Mn^{4+}$ (PFS) has a 0.78% emission at wavelengths longer than 650 and a 0.20% emission at wavelengths ≥665 nm, based on total emission and the combination of $RbMgPO_4:U^{6+}$ with Na$_2$SiF$_6$:Mn$^{4+}$ (NFS) has a 0.41% at wavelengths longer than 650 and a 0.12% emission at wavelengths ≥665 nm, based on total emission.

Example 4

Figure 14:
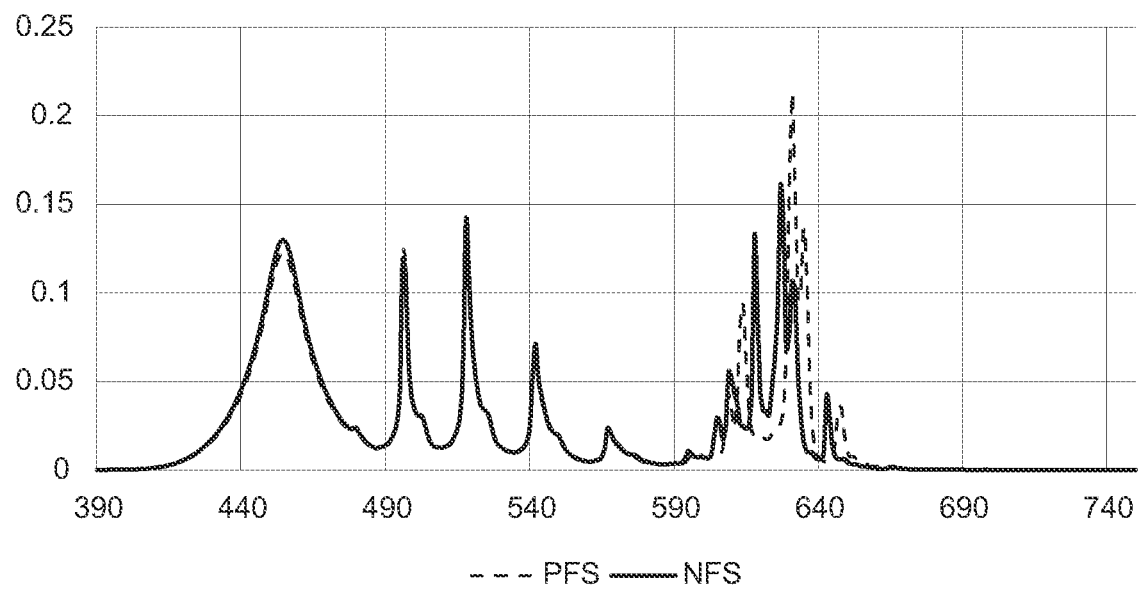
FIG. 14 shows an emission spectrum in the wavelength range of 390 to 740 for $BaZn_2(PO_4)_2:U^{6+}$ with $K_2SiF_6:Mn^{4+}$ (PFS) and $BaZn_2(PO_4)_2:U^{6+}$ with $Na_2SiF_6:Mn^{4+}$ (NFS).

FIG. 14 shows an emission spectrum of a phosphor material including a green-emitting phosphor, BaZn$_2$(PO$_4$)$_2$:U$^{6+}$, and a red phosphor, K$_2$SiF$_6$:Mn$^{4+}$ or Na$_2$SiF$_6$:Mn$^{4+}$. The combination of BaZn$_2$(PO$_4$)$_2$:U$^{6+}$ with K$_2$SiF$_6$:Mn$^{4+}$ (PFS) has a 0.85% emission at wavelengths longer than 650 and a 0.21% emission at wavelengths ≥665 nm, based on total emission and the combination of BaZn$_2$(PO$_4$)$_2$:U$^{6+}$ with Na$_2$SiF$_6$:Mn$^{4+}$ (NFS) has a 0.44% at wavelengths longer than 650 and a 0.13% emission at wavelengths ≥665 nm, based on total emission.

Example 5

Figure 15:
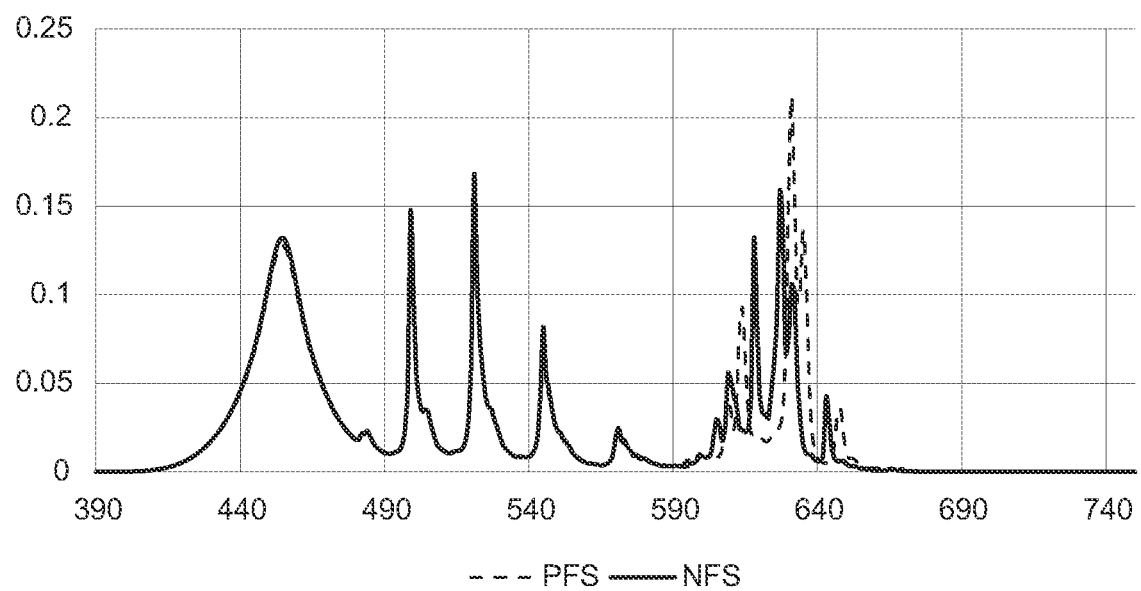
FIG. 15 shows an emission spectrum in the wavelength range of 390 to 740 for $BaBPO_5:U^{6+}$ with $K_2SiF_6:Mn^{4+}$ (PFS) and $BaBPO_5:U^{6+}$ with $Na_2SiF_6:Mn^4$ (NFS).

FIG. 15 shows an emission spectrum of a phosphor material including a green-emitting phosphor, BaBPO$_5$:U$^{6+}$, and a red phosphor, K$_2$SiF$_6$:Mn$^{4+}$ or Na$_2$SiF$_6$:Mn$^{4+}$. The combination of BaBPO$_5$:U$^{6+}$ with K$_2$SiF$_6$:Mn$^{4+}$ (PFS) has a 0.84% emission at wavelengths longer than 650 and a 0.21% emission at wavelengths ≥665 nm, based on total emission and the combination of BaBPO$_5$:U$^{6+}$ with Na$_2$SiF$_6$:Mn$^{4+}$ (NFS) has a 0.44% at wavelengths longer than 650 and a 0.13% emission at wavelengths ≥665 nm, based on total emission.

Example 6

Figure 16:
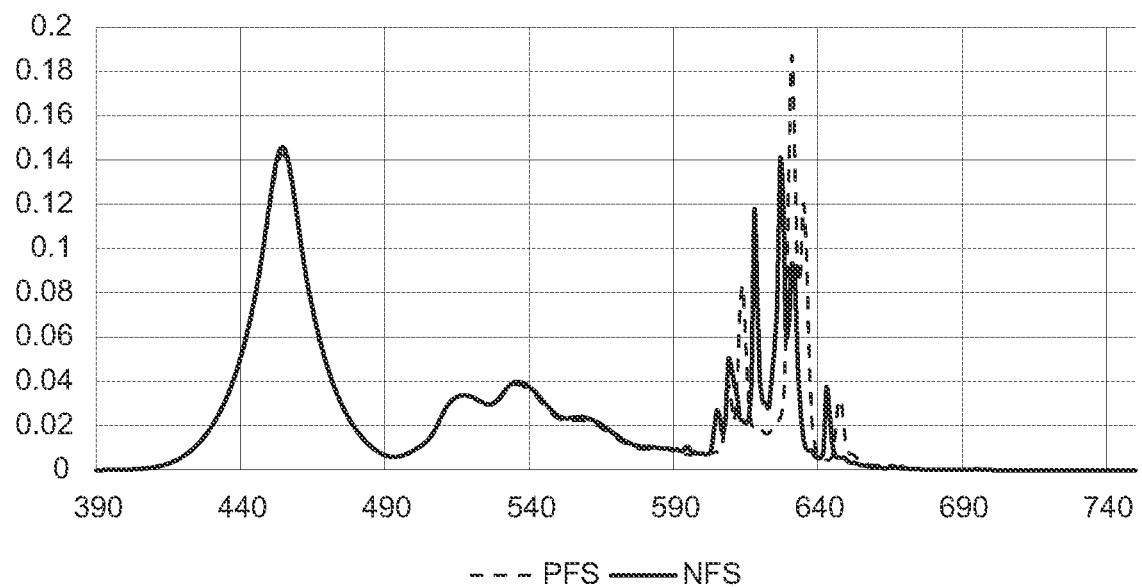
FIG. 16 shows an emission spectrum in the wavelength range of 390 to 740 for $Ba_6Al_5P_5O_{26}:U^{6+}$ with $K_2SiF_6:Mn^{4+}$ (PFS) and $Ba_6Al_5P_5O_{26}:U^{6+}$ with $Na_2SiF_6:Mn^{4+}$ (NFS).

FIG. 16 shows an emission spectrum of a phosphor material including a green-emitting phosphor, Ba$_6$Al$_5$P$_5$O$_{26}$:U$^{6+}$, and a red phosphor, K$_2$SiF$_6$:Mn$^{4+}$ or Na$_2$SiF$_6$:Mn$^{4+}$. The combination of Ba$_6$Al$_5$P$_5$O$_{26}$:U$^{6+}$ with K$_2$SiF$_6$:Mn$^{4+}$ (PFS) has a 0.84% emission at wavelengths longer than 650 and a 0.23% emission at wavelengths ≥665 nm, based on total emission and the combination of Ba$_6$Al$_5$P$_5$O$_{26}$:U$^{6+}$ with Na$_2$SiF$_6$:Mn$^{4+}$ (NFS) has a 0.51% at wavelengths longer than 650 and a 0.18% emission at wavelengths ≥665 nm, based on total emission.

Example 7

Figure 17:
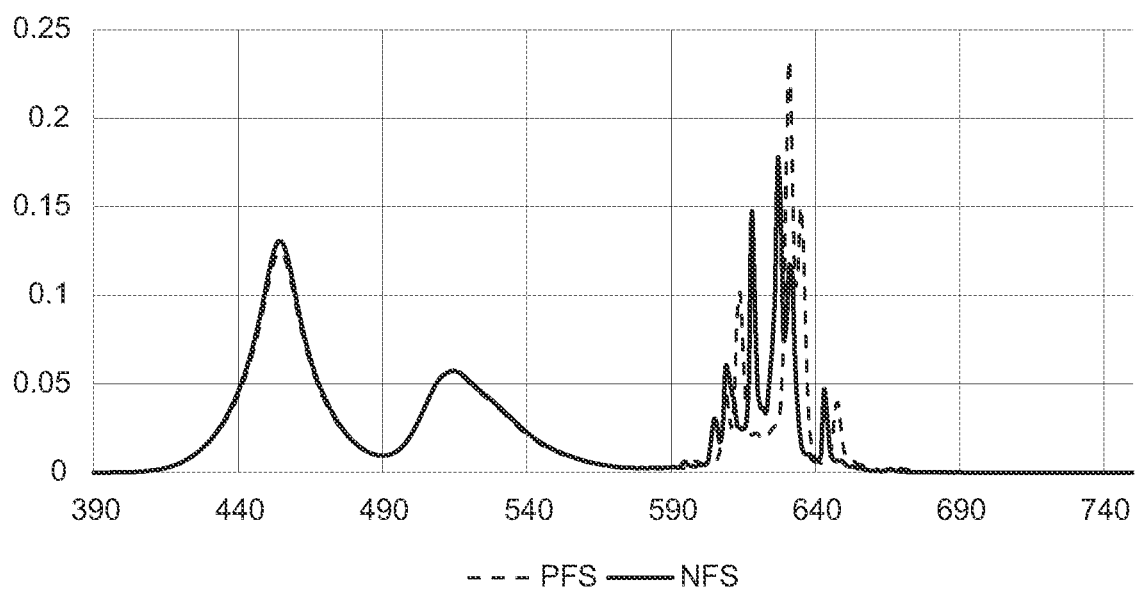
FIG. 17 shows an emission spectrum in the wavelength range of 390 to 740 for $Sr_3B_2O_6:U^{6+}$ with $K_2SiF_6:Mn^{4+}$ (PFS) and $Sr_3B_2O_6:U^{6+}$ with $Na_2SiF_6:Mn^{4+}$ (NFS).

FIG. 17 shows an emission spectrum of a phosphor material including a green-emitting phosphor, Sr$_3$B$_2$O$_6$:U$^{6+}$, and a red phosphor, K$_2$SiF$_6$:Mn$^{4+}$ or Na$_2$SiF$_6$:Mn$^{4+}$. The combination of Sr$_3$B$_2$O$_6$:U$^{6+}$ with K$_2$SiF$_6$:Mn$^{4+}$ (PFS) has a 0.94% emission at wavelengths longer than 650 and a 0.23% emission at wavelengths ≥665 nm, based on total emission and the combination of Sr$_3$B$_2$O$_6$:U$^{6+}$ with Na$_2$SiF$_6$:Mn$^{4+}$ (NFS) has a 0.49% at wavelengths longer than 650 and a 0.14% emission at wavelengths ≥665 nm, based on total emission.

Example 8

Figure 18:
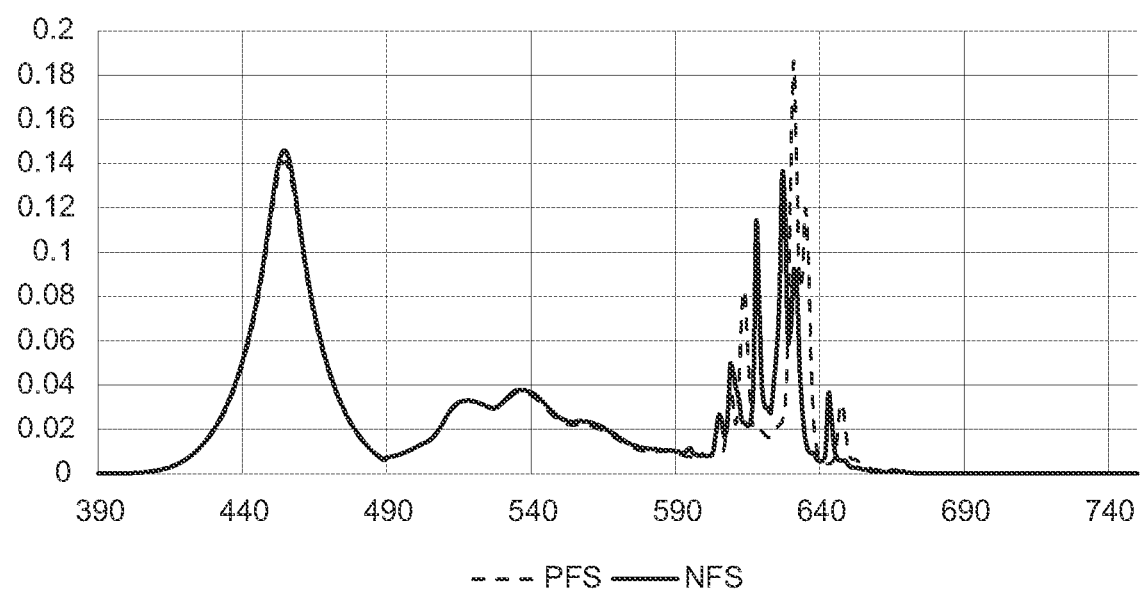
FIG. 18 shows an emission spectrum in the wavelength range of 390 to 740 for green phosphor $\gamma$-$Ba_2UO_2(PO_4)_2$ with $K_2SiF_6:Mn^{4+}$ (PFS) and $\gamma$-$Ba_2UO_2(PO_4)_2$ with $Na_2SiF_6:Mn^{4+}$ (NFS).

FIG. 18 shows an emission spectrum of a phosphor material including a green-emitting phosphor, γ-Ba$_2$UO$_2$(PO$_4$)$_2$, and a red phosphor, K$_2$SiF$_6$:Mn$^{4+}$ or Na$_2$SiF$_6$:Mn$^{4+}$. The combination of γ-Ba$_2$UO$_2$(PO$_4$)$_2$ with K$_2$SiF$_6$:Mn$^{4+}$ has a 0.73% emission at wavelengths longer than 650 and a 0.18% emission at wavelengths ≥665 nm, based on total emission and the combination of the green phosphor with a red phosphor Na$_2$SiF$_6$:Mn$^{4+}$ has a 0.37% at wavelengths longer than 650 based and a 0.11% emission at wavelengths ≥665 nm, based on total emission.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A device used in conjunction with night vision equipment, the device comprising an LED light source optically coupled and/or radiationally connected to a phosphor material comprising a green-emitting phosphor and a red-emitting phosphor of formula I:

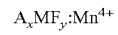

$$A_xMF_y:Mn^{4+} \qquad I$$

wherein A is Li, Na, K, Rb, Cs, or a combination thereof; M is Si, Ge, Sn, Ti, Zr, Al, Ga, In, Sc, Hf, Y, La, Nb, Ta, Bi, Gd, or a combination thereof, x is an absolute value of a charge of the MF$_y$ ion; and y is 5, 6 or 7; and wherein the device limits emission of wavelengths longer than 650 nm to less than 1.75% of total emission.

2. The device according to claim 1, wherein the red-emitting phosphor is K$_2$SiF$_6$:Mn$^{4+}$ or Na$_2$SiF$_6$:Mn$^{4+}$.

3. A device according to claim 1 wherein the green-emitting phosphor material comprises a sulfide phosphor, uranium-doped phosphor or quantum dot material.

4. A device according to claim 3, wherein the uranium-doped phosphor comprises phosphors selected from the group consisting of γ-Ba$_2$UO$_2$(PO$_4$)$_2$, (Ba, Zn, Mg, UO$_2$)$_3$(PO$_4$)$_2$, Ba(UO$_2$)P$_2$O$_7$, BaMgUO$_2$(PO$_4$)$_2$, BaZnUO$_2$(PO$_4$)$_2$, Ba$_3$(PO$_4$)$_2$(UO$_2$)$_2$P$_2$O$_7$, Ba$_2$Sr(PO$_4$)$_2$(UO$_2$)$_2$P$_2$O$_7$, BaSr$_2$(PO$_4$)$_2$(UO$_2$)$_2$P$_2$O$_7$, Sr$_3$(PO$_4$)$_2$(UO$_2$)$_2$P$_2$O$_7$, Ca$_3$(PO$_4$)$_2$(UO$_2$)$_2$P$_2$O$_7$, BaMg$_2$(PO$_4$)$_2$(UO$_2$)$_2$P$_2$O$_7$, Ba$_2$UO$_2$(VO$_4$)$_2$, RbMgPO$_4$:U$^{6+}$, BaZn$_2$(PO$_4$)$_2$:U$^{6+}$, BaBPO$_5$:U$^{6+}$, Ba$_6$Al$_5$P$_5$O$_{26}$:U$^{6+}$, Sr$_3$B$_2$O$_6$:U$^{6+}$, Ba$_2$Mg(PO$_4$)$_2$(UO$_2$)$_2$P$_2$O$_7$:U$^{6+}$ and Ba$_3$(UO$_2$)$_2$P$_2$O$_7$(PO$_4$)$_2$.

5. A device according to claim 3, wherein the quantum dot material comprises perovskite.

6. A lighting apparatus comprising the device of claim 1.

7. A backlight apparatus comprising the device of claim 1.

8. A device used in conjunction with night vision equipment, the device comprising an LED light source optically coupled and/or radiationally connected to a phosphor material including a red-emitting phosphor having the formula Na$_2$SiF$_6$:Mn$^{4+}$, wherein the device limits emission of wavelengths longer than 650 nm to no more than 1.0% of total emission.

9. A single mode display used in conjunction with night vision equipment and compatible with day lighting and night lighting, the single mode display comprising the backlight apparatus of claim 7, and in the absence of an NVIS filter.

10. A single mode display compatible with night vision equipment and day lighting, the single mode display comprising the backlight apparatus of claim 7, and an NVIS filter having an optical density of 1.0 or less.

11. A display compatible with day lighting and compatible with night vision equipment, the display comprising the backlight apparatus of claim 7, wherein a color gamut in day lighting decreases by less than 20% when in use with night vision equipment.

12. A television comprising the backlight apparatus of claim 7.

13. A mobile phone comprising the backlight apparatus of claim 7.

14. A computer monitor comprising the backlight apparatus of claim 7.

15. A tablet computer comprising the backlight apparatus of claim 7.

16. A laptop comprising the backlight apparatus of claim 7.

17. A notebook computer comprising the backlight apparatus of claim 7.

18. A vehicular display comprising the backlight apparatus of claim 7.

19. A night vision display comprising the backlight apparatus of claim 7.

20. A display compatible with day lighting and compatible with night vision equipment, the display comprising a backlight apparatus comprising a device used in conjunction with night vision equipment, the device comprising an LED light source optically coupled and/or radiationally connected to a phosphor material including a red-emitting phosphor having the formula $Na_2SiF_6:Mn^{4+}$, wherein the device limits emission of wavelengths longer than 650 nm to no more than 1.0% of total emission, and wherein (1) a color gamut in day lighting decreases by less than 20% when in use with night vision equipment; (2) the backlight apparatus produces a white light and a color shift in a red spectrum decreases by less than 10% when in use with night vision equipment; or (3) a brightness in day lighting decreases by no more than 25% when in use with night vision equipment.

21. A lighting apparatus comprising the device of claim 8.

22. A backlight apparatus comprising the device of claim 8.

23. A display compatible with day lighting and compatible with night vision equipment, the display comprising the backlight apparatus of claim 7, wherein the backlight apparatus produces a white light and a color shift in a red spectrum decreases by less than 10% when in use with night vision equipment.

24. A display compatible with day lighting and compatible with night vision equipment, the display comprising the backlight apparatus of claim 7, wherein a brightness in day lighting decreases by no more than 25% when in use with night vision equipment.

* * * * *